US011302339B2

(12) United States Patent
Laitinen et al.

(10) Patent No.: US 11,302,339 B2
(45) Date of Patent: Apr. 12, 2022

(54) SPATIAL SOUND REPRODUCTION USING MULTICHANNEL LOUDSPEAKER SYSTEMS

(71) Applicant: Nokia Technologies Oy, Espoo (FI)

(72) Inventors: Mikko-Ville Laitinen, Espoo (FI); Juha Tapio Vilkamo, Helsinki (FI); Tapani Pihlajakuja, Vantaa (FI); Antti Johannes Eronen, Tampere (FI)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 16/978,032

(22) PCT Filed: Mar. 7, 2019

(86) PCT No.: PCT/FI2019/050179
§ 371 (c)(1),
(2) Date: Sep. 3, 2020

(87) PCT Pub. No.: WO2019/175473
PCT Pub. Date: Sep. 19, 2019

(65) Prior Publication Data
US 2020/0411020 A1 Dec. 31, 2020

(30) Foreign Application Priority Data
Mar. 13, 2018 (EP) .................................. 18161580

(51) Int. Cl.
*H04R 5/02* (2006.01)
*G10L 19/02* (2013.01)
(Continued)

(52) U.S. Cl.
CPC ............ *G10L 19/02* (2013.01); *G10L 19/083* (2013.01); *H03M 7/6011* (2013.01); *H04S 7/00* (2013.01)

(58) Field of Classification Search
CPC .... G10L 19/02; G10L 19/083; H03M 7/6011; H04S 7/00
(Continued)

(56) References Cited

U.S. PATENT DOCUMENTS

2015/0117650 A1    4/2015   Jo et al.

FOREIGN PATENT DOCUMENTS

| CN | 106465027 A | 2/2017 | |
| EP | 2892250 A1 * | 7/2015 | ............... H04S 3/02 |

(Continued)

OTHER PUBLICATIONS

Gretzki et al., "A New Method for Elevation Panning Reducing the Size of the Resulting Auditory Events", TecniAcustica, 2003, 6 pages.

(Continued)

*Primary Examiner* — Ammar T Hamid
(74) *Attorney, Agent, or Firm* — Alston & Bird LLP

(57) ABSTRACT

An apparatus for spatial audio signal decoding associated with a plurality of speaker nodes (201, 203, 205, 207, 209) placed within a three dimensional space, the apparatus comprising at least one processor and at least one memory including a computer program code. The at least one memory and the computer program code configured to, with the at least one processor, cause the apparatus at least to determine a non-overlapping virtual surface arrangement (400), the virtual surface arrangement (400) comprising a plurality of virtual surfaces (421, 423, 431, 433) with corners positioned at at least three speaker nodes of the plurality of speaker nodes (201, 203, 205, 207, 209) and sides connecting pairs of corners configured to be non-intersecting with at least one defined virtual plane within the three dimensional space. The apparatus is further caused to generate gains for the speaker nodes based on the deter- (Continued)

mined the virtual surface arrangement and apply the gains to at least one audio signal, the at least one audio signal to be positioned within the three dimensional space.

20 Claims, 17 Drawing Sheets

(51) Int. Cl.
  *G10L 19/083* (2013.01)
  *H03M 7/30* (2006.01)
  *H04S 7/00* (2006.01)
(58) Field of Classification Search
  USPC .................................................. 381/310, 300
  See application file for complete search history.

(56) References Cited

FOREIGN PATENT DOCUMENTS

| EP | 2892250 A1 | 7/2015 |
|----|------------|--------|
| WO | 2014/044332 A1 | 3/2014 |
| WO | 2014/160576 A2 | 10/2014 |

OTHER PUBLICATIONS

Pulkki, "Virtual Source Positioning using Vector Base Amplitude Panning", J. Audio Eng. Soc., vol. 45, No. 6, Jun. 1997, pp. 456-466.

Pulkki et al., "Creating Auditory Displays with Multiple Loudspeakers Using A VBAP: A Case Study with DIVA Project", International Conference on Auditory Display, 1998, pp. 1-5.

Extended European Search Report received for corresponding European Patent Application No. 18161580.8, dated Sep. 19, 2018, 8 pages.

"Information Technology—High Efficiency Coding and Media Delivery in Heterogeneous Environments—Part 3: 30 Audio", ISO/IEC 23008-3:201x€, ISOilEC ,JTC 1/SC 29/WG 11,Oct. 12, 2016, 798 pages.

International Search Report and Written Opinion received for corresponding Patent Cooperation Treaty Application No. PCT/FI2019/050179, dated May 23, 2019, 15 pages.

"DTS-UHD Point Source Renderer", ETSI TS 103 584, V1.1.1, Jan. 2018, pp. 1-67.

Baribeau, "Methodes de Spatialisation Sonore et Intégration dans le Processus de Composition", Master's Dissertation, Jul. 2014, 90 pages.

Romanov et al., "Manipulations Improving Amplitude Panning on Small Standard Loudspeaker Arrangements for Surround with Height", 29th Tonmeistertagung, VDT International Convention, Nov. 2016, 5 pages.

Franck et al., "Comparison of Listener-Centric Sound Field Reproduction Methods in a Convex Optimization Framework", AES Conference on Sound Field Control, Jul. 18-20, 2016, pp. 1-10.

Herre et al., "MPEG-H 3D Audio—The New Standard for Coding of Immersive Spatial Audio", IEEE Journal of Selected Topics in Signal Processing,vol. 9, No. 5, Aug. 2015, pp. 770-779.

Barber, "The Quickhull Algorithm for Convex Hulls", ACM Transactions on Mathematical Software, vol. 22, No. 4, Dec. 1996, pp. 469-483.

Office action received for corresponding Chinese Patent Application No. 201980018728 8, dated Apr. 2, 2021, 8 pages of office action and 1 page of Translation available.

First Examination Report for Indian Application No. 202047044106 dated Dec. 2, 2021, 8 pages.

\* cited by examiner

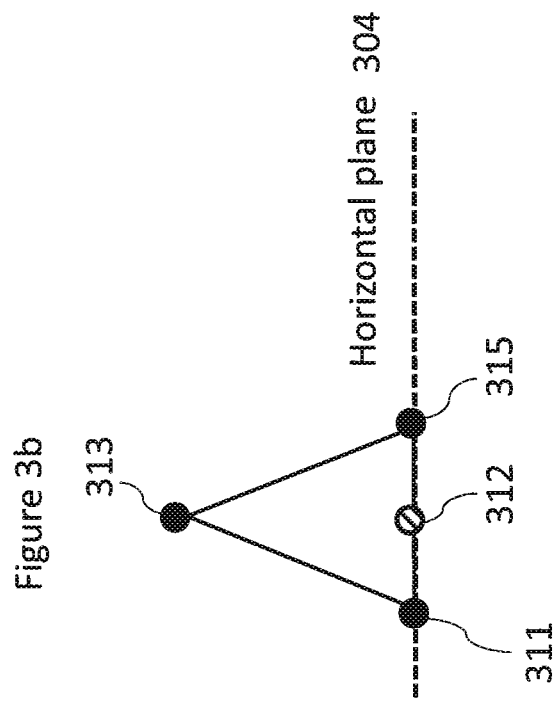
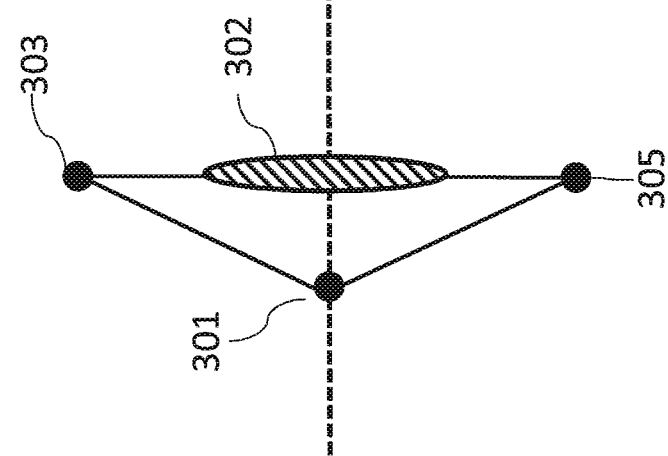

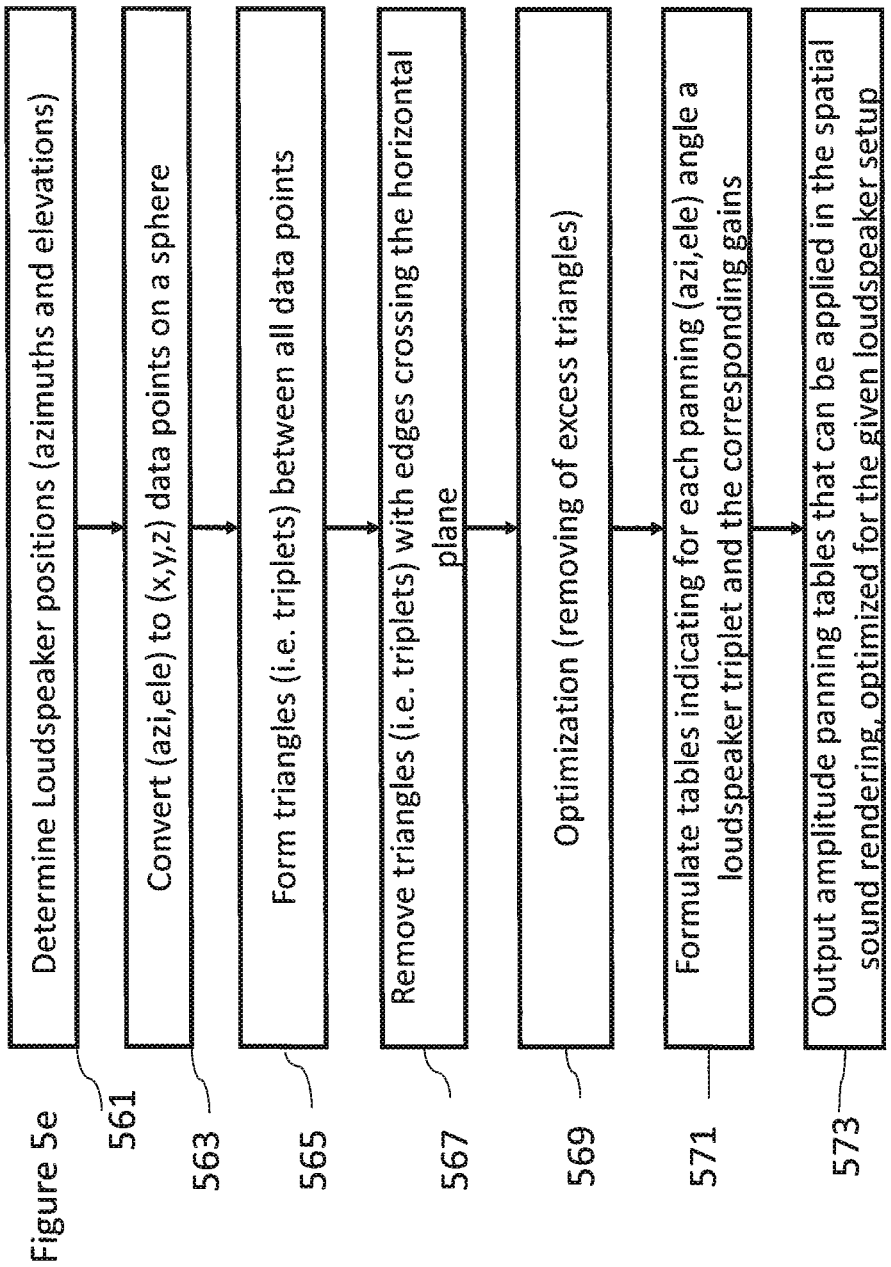

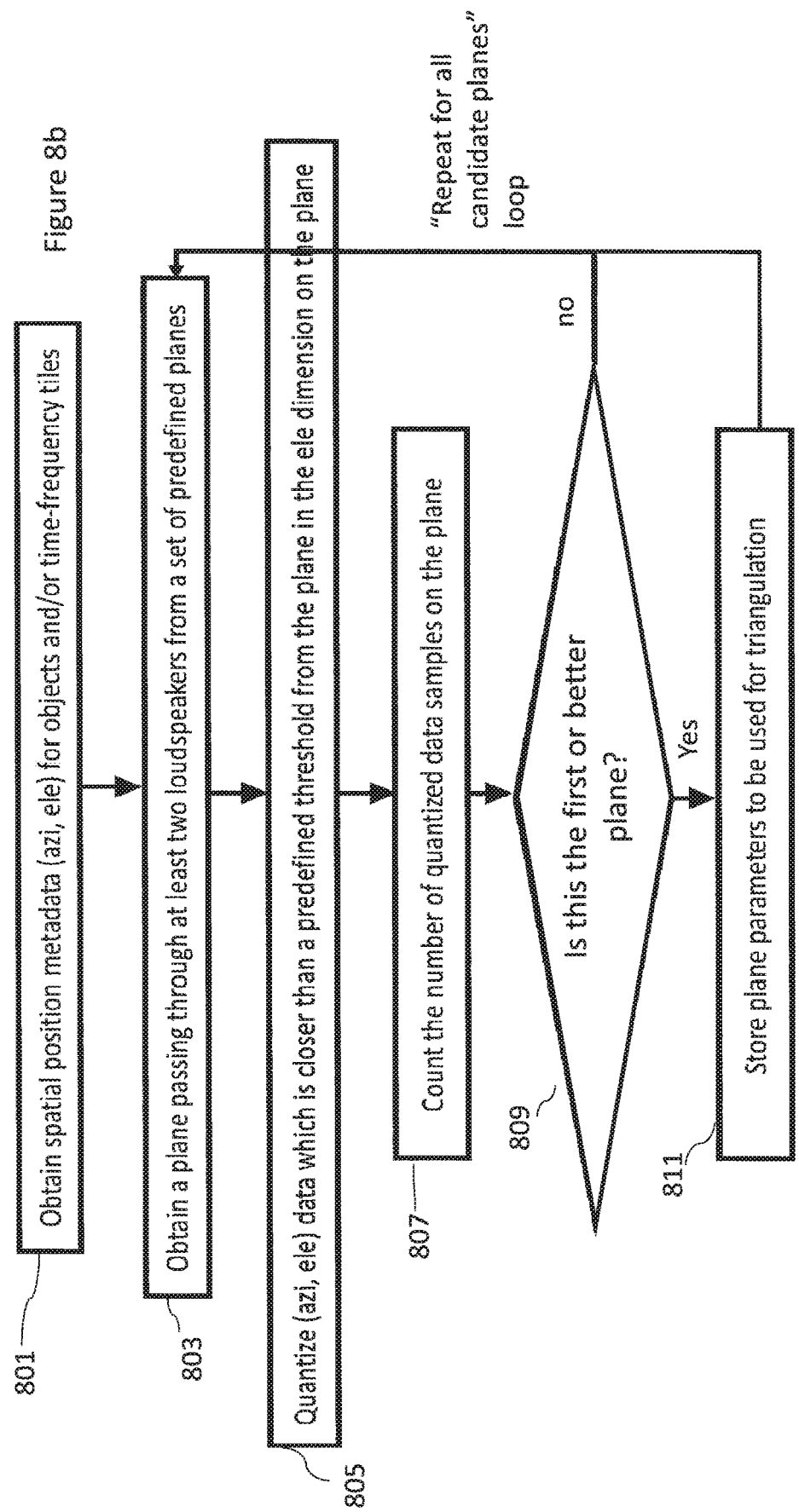

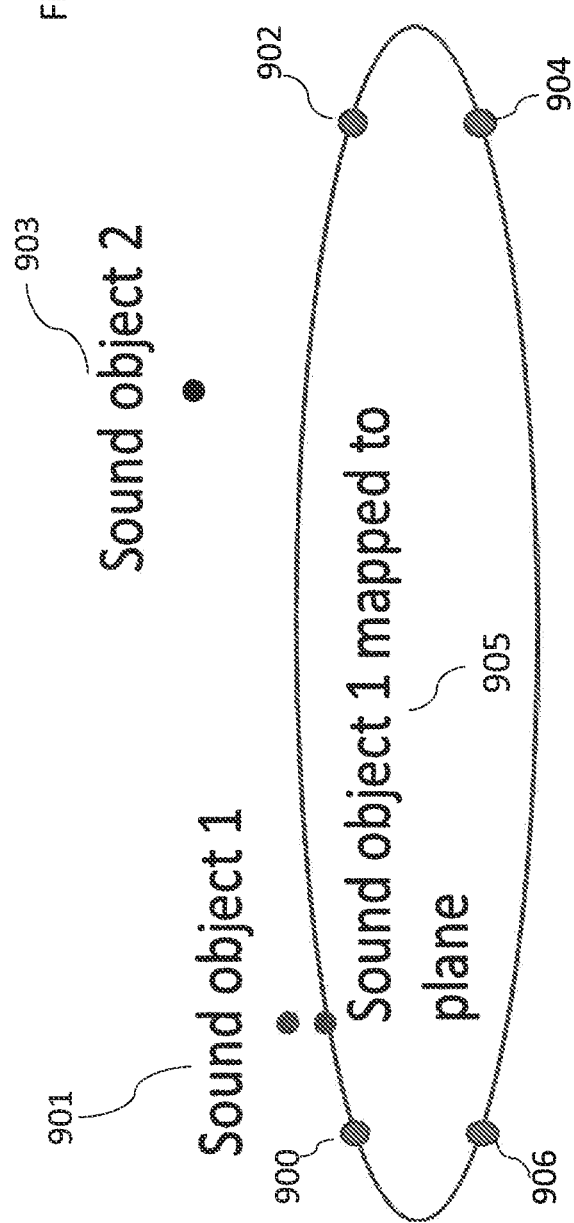

SPATIAL SOUND REPRODUCTION USING MULTICHANNEL LOUDSPEAKER SYSTEMS

RELATED APPLICATION

This application claims priority to PCT Application No. PCT/FI2019/050179, filed on Mar. 7, 2019, which claims priority to European Application No. 18161580.8, filed on Mar. 13, 2018, each of which is incorporated herein by reference in its entirety.

FIELD

The present application relates to apparatus and methods for spatial sound reproduction using multichannel loudspeaker systems. This includes but is not exclusively for systems where the multichannel loudspeaker setup is a virtual multichannel loudspeaker setup.

BACKGROUND

Parametric spatial audio processing is a field of audio signal processing where the spatial aspect of the sound is described using a set of parameters. For example, in parametric spatial audio capture from microphone arrays, it is a typical and an effective choice to estimate from the microphone array signals a set of parameters such as directions of the sound in frequency bands, and the ratio parameters expressing relative energies of the directional and non-directional parts of the captured sound in frequency bands. These parameters are known to well describe the perceptual spatial properties of the captured sound at the position of the microphone array. These parameters can be utilized in synthesis of the spatial sound accordingly, for headphones binaurally, for loudspeakers, or to other formats, such as Ambisonics.

The directions and direct-to-total energy ratios in frequency bands are thus a parameterization that is particularly effective for spatial audio capture.

A parameter set consisting of a direction parameter in frequency bands and an energy ratio parameter in frequency bands (indicating the proportion of the sound energy that is directional) can be also utilized as the spatial metadata for an audio codec. For example, these parameters can be estimated from microphone-array captured audio signals, and for example a stereo signal can be generated from the microphone array signals to be conveyed with the spatial metadata. The stereo signal could be encoded, for example, with an AAC encoder. A decoder can decode the audio signals into PCM signals, and process the sound in frequency bands (using the spatial metadata) to obtain the spatial output, for example a binaural output.

Reproduction of the spatial audio signals (Spatial sound reproduction) typically requires positioning sound in 3D space to arbitrary directions. These directions may be obtained automatically, e.g., from sound scene parameters, or they may be set by the user. Vector base amplitude panning (VBAP) is a common method to position spatial audio signals using loudspeaker setups.

VBAP is typically based on
1) automatically or manually triangulating the loudspeaker setup,
2) selecting appropriate triangle(s) based on the direction (such that for a given direction three loudspeakers are selected which form a triangle where the given direction falls in), and
3) computing gains based on the direction for the three loudspeakers forming the particular triangle.

In a practical implementation, VBAP gains (for each azimuth and elevation) and the loudspeaker triplets (for each azimuth and elevation) may be pre-formulated into a lookup table stored in the memory. Such a real-time system then performs the amplitude panning by finding from the memory the appropriate loudspeaker triplet for the desired panning direction, and the gains for these loudspeakers corresponding to the desired panning direction.

SUMMARY

There is provided according to an apparatus comprising at least one processor and at least one memory including a computer program code, the at least one memory and the computer program code configured to, with the at least one processor, cause the apparatus at least to: determine a non-overlapping virtual surface arrangement, the virtual surface arrangement comprising a plurality of virtual surfaces with corners positioned at at least three speaker nodes of the plurality of speaker nodes and sides connecting pairs of corners configured to be non-intersecting with at least one defined virtual plane within the three dimensional space; generate gains for the speaker nodes based on the determined the virtual surface arrangement; apply the gains to at least one audio signal, the at least one audio signal to be positioned within the three dimensional space.

The apparatus caused to determine a non-overlapping virtual surface arrangement may be caused to: divide the speaker nodes into parts, wherein at least one part comprises speaker nodes located to one side or on the defined virtual plane, and at least one further part comprises speaker nodes located to the other side or on the defined virtual plane; determine virtual surface edges for the at least one part and virtual surface edges for the at least one further part; combine the virtual surface edges for the at least one part and the virtual surface edges for the at least one further part to generate the plurality of virtual surfaces and therefore determine the non-overlapping virtual surface arrangement.

The apparatus caused to divide the loudspeaker or speaker nodes into parts may be caused to divide the speaker nodes to an additional part comprising speaker nodes located on or close to the defined virtual plane, wherein the apparatus caused to determine the virtual surface edges for the at least one part may be further caused to virtually connect speaker nodes for the at least one part comprising loudspeaker or speaker nodes located on or close to the defined virtual plane.

The apparatus caused to determine the at least one virtual surface edges may be further caused to: determine candidate virtual surface edges based on selecting pairs of speaker nodes; and process the candidate virtual surface edges to determine the virtual surface edges.

The apparatus caused to process the candidate virtual surface edges to determine the virtual surface edges may be further caused to: select one of the candidate virtual surface edges until all of the candidate virtual surface edges are selected; discard the one of the candidate virtual surface edges when the one of the candidate virtual surface edges crosses the defined virtual plane; discard the one of the candidate virtual surface edges when the one of the candidate virtual surface edges has any speaker node substantially behind, with respect to a defined observation point, the one of the candidate virtual surface edges;

determine whether the one of the candidate virtual surface edges intersect with at least one previous candidate virtual surface edge and discard the at least one previous candidate virtual surface edge when the previous candidate virtual surface edge was longer and otherwise discard the one of the candidate virtual surface edges.

The apparatus caused to determine whether the one of the candidate virtual surface edges intersect with at least one previous candidate virtual surface edge and discard the at least one previous candidate virtual surface edge when the previous candidate virtual surface edge was longer and otherwise discard the one of the candidate virtual surface edges may be caused to apply at least one weighting to a length of one or other of the candidate virtual surface edges and/or previous candidate virtual surface edge prior to a comparison.

The apparatus may be further caused to add at least one virtual speaker node at a defined location.

The apparatus may be caused to perform at least one of: add a virtual speaker node directly at the top of a sphere defined by the speaker nodes; add a virtual speaker node directly at the bottom of a sphere defined by the speaker nodes; and add at least one virtual speaker node where speaker nodes are determined to be sparse.

The apparatus may be further caused to move at least one speaker node to the defined virtual plane when the at least one speaker node is within a defined threshold distance from the defined virtual plane.

The apparatus may be further caused to remove at least one speaker node when the at least one speaker node is within a defined threshold distance of at least one further speaker node.

The apparatus may be further caused to merge at least two speaker nodes when the at least two speaker nodes are within a defined threshold distance of each other.

The apparatus caused to determine a non-overlapping virtual surface arrangement may be caused to: generate a first arrangement where for at least one virtual surface the corners are associated with adjacent speaker nodes; analyse the first arrangement to determine whether at least one virtual edge of the at least one virtual surface intersects with the defined virtual plane; and remove or redefine the at least one virtual surface based on determining the at least one virtual edge of the first arrangement intersects with the defined virtual plane.

The apparatus caused to determine a non-overlapping virtual surface arrangement may be caused to: define sectors of the non-overlapping virtual surface arrangement either side of the defined virtual plane; generate a first virtual surface arrangement comprising a first plurality of virtual surfaces with corners positioned at at least three speaker nodes of the plurality of speaker nodes and sides connecting pairs of corners and which are associated with speaker nodes located within a first sector and a first virtual speaker node located within a second sector opposite the first sector; remove from the first virtual surface arrangement any virtual surface that includes the first virtual speaker node as a corner; generate a second virtual surface arrangement comprising a second plurality of virtual surfaces with corners positioned at at least three speaker nodes of the plurality of speaker nodes and sides connecting pairs of corners and which are associated with speaker nodes located within the second sector and a second virtual speaker node located within the first sector; remove from the second virtual surface arrangement any virtual surface that includes the second virtual speaker node as a corner; and generate the virtual surface arrangement by combination of the first virtual surface arrangement and second virtual surface arrangement.

The defined virtual plane may be at least one of: a horizontal plane with an elevation of zero; a horizontal plane linking at least two or more loudspeaker or speaker nodes; a plane linking at least two or more loudspeaker or speaker nodes; and a plane defined by analysis of the at least one audio signal.

The speaker nodes may comprise at least one of: a physical loudspeaker; a virtual loudspeaker; and a binaural filter node.

The apparatus caused to generate gains for the speaker nodes based on the determined virtual surface arrangement may be further caused to: generate at least one look up table of gains for the speaker nodes; and generate, based on a real time request comprising a direction associated with the at least one audio signal, gains for the speaker nodes.

The apparatus caused to apply the gains to at least one audio signal, the at least one audio signal to be positioned within the three dimensional space may be caused to apply a vector base amplitude panning by applying the determined gains to the at least one audio signal to generate audio signals for the speaker nodes.

According to a second aspect there is provided a method comprising: determining a non-overlapping virtual surface arrangement, the virtual surface arrangement comprising a plurality of virtual surfaces with corners positioned at at least three speaker nodes of the plurality of speaker nodes and sides connecting pairs of corners configured to be non-intersecting with at least one defined virtual plane within the three dimensional space; generating gains for the speaker nodes based on the determined the virtual surface arrangement; applying the gains to at least one audio signal, the at least one audio signal to be positioned within the three dimensional space.

Determining a non-overlapping virtual surface arrangement may comprise: dividing the speaker nodes into parts, wherein at least one part comprises speaker nodes located to one side or on the defined virtual plane, and at least one further part comprises speaker nodes located to the other side or on the defined virtual plane; determining virtual surface edges for the at least one part and virtual surface edges for the at least one further part; combining the virtual surface edges for the at least one part and the virtual surface edges for the at least one further part to generate the plurality of virtual surfaces and therefore determining the non-overlapping virtual surface arrangement.

Dividing the loudspeaker or speaker nodes into parts may comprise dividing the speaker nodes to an additional part comprising speaker nodes located on or close to the defined virtual plane, wherein determining the virtual surface edges for the at least one part may comprise virtually connecting speaker nodes for the at least one part comprising loudspeaker or speaker nodes located on or close to the defined virtual plane.

Determining the at least one virtual surface edges may comprise: determining candidate virtual surface edges based on selecting pairs of speaker nodes; and processing the candidate virtual surface edges to determine the virtual surface edges.

Processing the candidate virtual surface edges to determine the virtual surface edges may further comprise: selecting one of the candidate virtual surface edges until all of the candidate virtual surface edges are selected; discarding the one of the candidate virtual surface edges when the one of the candidate virtual surface edges crosses the defined virtual plane; discarding the one of the candidate virtual surface edges when the one of the candidate virtual surface edges has any speaker node substantially behind, with respect to a defined observation point, the one of the candidate virtual surface edges; determining whether the one of the candidate virtual surface edges intersect with at least one previous candidate virtual surface edge and discarding the at least one previous candidate virtual surface edge when the previous candidate virtual surface edge was longer and otherwise discarding the one of the candidate virtual surface edges.

Determining whether the one of the candidate virtual surface edges intersect with at least one previous candidate virtual surface edge and discarding the at least one previous candidate virtual surface edge when the previous candidate virtual surface edge was longer and otherwise discarding the one of the candidate virtual surface edges may comprise applying at least one weighting to a length of one or other of the candidate virtual surface edges and/or previous candidate virtual surface edge prior to a comparison.

The method may comprise adding at least one virtual speaker node at a defined location.

The method may comprise performing at least one of: adding a virtual speaker node directly at the top of a sphere defined by the speaker nodes; adding a virtual speaker node directly at the bottom of a sphere defined by the speaker nodes; and adding at least one virtual speaker node where speaker nodes are determined to be sparse.

The method may further comprise moving at least one speaker node to the defined virtual plane when the at least one speaker node is within a defined threshold distance from the defined virtual plane.

The method may further comprise removing at least one speaker node when the at least one speaker node is within a defined threshold distance of at least one further speaker node.

The method may further comprise merging at least two speaker nodes when the at least two speaker nodes are within a defined threshold distance of each other.

Determining a non-overlapping virtual surface arrangement may comprise: generating a first arrangement where for at least one virtual surface the corners are associated with adjacent speaker nodes; analysing the first arrangement to determine whether at least one virtual edge of the at least one virtual surface intersects with the defined virtual plane; and removing or redefining the at least one virtual surface based on determining the at least one virtual edge of the first arrangement intersects with the defined virtual plane.

Determining a non-overlapping virtual surface arrangement may comprise: defining sectors of the non-overlapping virtual surface arrangement either side of the defined virtual plane; generating a first virtual surface arrangement comprising a first plurality of virtual surfaces with corners positioned at at least three speaker nodes of the plurality of speaker nodes and sides connecting pairs of corners and which are associated with speaker nodes located within a first sector and a first virtual speaker node located within a second sector opposite the first sector; removing from the first virtual surface arrangement any virtual surface that includes the first virtual speaker node as a corner; generating a second virtual surface arrangement comprising a second plurality of virtual surfaces with corners positioned at at least three speaker nodes of the plurality of speaker nodes and sides connecting pairs of corners and which are associated with speaker nodes located within the second sector and a second virtual speaker node located within the first sector; removing from the second virtual surface arrangement any virtual surface that includes the second virtual speaker node as a corner; and generating the virtual surface arrangement by combination of the first virtual surface arrangement and second virtual surface arrangement.

The defined virtual plane may be at least one of: a horizontal plane with an elevation of zero; a horizontal plane linking at least two or more loudspeaker or speaker nodes; a plane linking at least two or more loudspeaker or speaker nodes; and a plane defined by analysis of the at least one audio signal.

The speaker nodes may comprise at least one of: a physical loudspeaker; a virtual loudspeaker; and a binaural filter node.

Generating gains for the speaker nodes based on the determined virtual surface arrangement may further comprise: generating at least one look up table of gains for the speaker nodes; and generating, based on a real time request comprising a direction associated with the at least one audio signal, gains for the speaker nodes.

Applying the gains to at least one audio signal, the at least one audio signal to be positioned within the three dimensional space may comprise applying a vector base amplitude panning by applying the determined gains to the at least one audio signal to generate audio signals for the speaker nodes.

According to a third aspect there is provided an apparatus comprising means for: determining a non-overlapping virtual surface arrangement, the virtual surface arrangement comprising a plurality of virtual surfaces with corners positioned at at least three speaker nodes of the plurality of speaker nodes and sides connecting pairs of corners configured to be non-intersecting with at least one defined virtual plane within the three dimensional space; generating gains for the speaker nodes based on the determined the virtual surface arrangement; applying the gains to at least one audio signal, the at least one audio signal to be positioned within the three dimensional space.

The means for determining a non-overlapping virtual surface arrangement may be configured for: dividing the speaker nodes into parts, wherein at least one part comprises speaker nodes located to one side or on the defined virtual plane, and at least one further part comprises speaker nodes located to the other side or on the defined virtual plane; determining virtual surface edges for the at least one part and virtual surface edges for the at least one further part; combining the virtual surface edges for the at least one part and the virtual surface edges for the at least one further part to generate the plurality of virtual surfaces and therefore determining the non-overlapping virtual surface arrangement.

The means for dividing the loudspeaker or speaker nodes into parts may be configured for dividing the speaker nodes to an additional part comprising speaker nodes located on or close to the defined virtual plane, wherein the means for determining the virtual surface edges for the at least one part may be configured for virtually connecting speaker nodes for the at least one part comprising loudspeaker or speaker nodes located on or close to the defined virtual plane.

The means for determining the at least one virtual surface edges may be configured for: determining candidate virtual surface edges based on selecting pairs of speaker nodes; and processing the candidate virtual surface edges to determine the virtual surface edges.

The means for processing the candidate virtual surface edges to determine the virtual surface edges may further be configured for: selecting one of the candidate virtual surface edges until all of the candidate virtual surface edges are selected; discarding the one of the candidate virtual surface edges when the one of the candidate virtual surface edges crosses the defined virtual plane; discarding the one of the candidate virtual surface edges when the one of the candidate virtual surface edges has any speaker node substantially behind, with respect to a defined observation point, the one of the candidate virtual surface edges; determining whether the one of the candidate virtual surface edges intersect with at least one previous candidate virtual surface edge and discarding the at least one previous candidate virtual surface edge when the previous candidate virtual surface edge was longer and otherwise discarding the one of the candidate virtual surface edges.

The means for determining whether the one of the candidate virtual surface edges intersect with at least one previous candidate virtual surface edge and discarding the at least one previous candidate virtual surface edge when the previous candidate virtual surface edge was longer and otherwise discarding the one of the candidate virtual surface edges may be configured for applying at least one weighting to a length of one or other of the candidate virtual surface edges and/or previous candidate virtual surface edge prior to a comparison.

The means for may be configured for adding at least one virtual speaker node at a defined location.

The means for may be configured for performing at least one of: adding a virtual speaker node directly at the top of a sphere defined by the speaker nodes; adding a virtual speaker node directly at the bottom of a sphere defined by the speaker nodes; and adding at least one virtual speaker node where speaker nodes are determined to be sparse.

The means for may be configured for moving at least one speaker node to the defined virtual plane when the at least one speaker node is within a defined threshold distance from the defined virtual plane.

The means for may be configured for removing at least one speaker node when the at least one speaker node is within a defined threshold distance of at least one further speaker node.

The means for may be configured for merging at least two speaker nodes when the at least two speaker nodes are within a defined threshold distance of each other.

The means for determining a non-overlapping virtual surface arrangement may be configured for: generating a first arrangement where for at least one virtual surface the corners are associated with adjacent speaker nodes; analysing the first arrangement to determine whether at least one virtual edge of the at least one virtual surface intersects with the defined virtual plane; and removing or redefining the at least one virtual surface based on determining the at least one virtual edge of the first arrangement intersects with the defined virtual plane.

The means for determining a non-overlapping virtual surface arrangement may be configured for: defining sectors of the non-overlapping virtual surface arrangement either side of the defined virtual plane; generating a first virtual surface arrangement comprising a first plurality of virtual surfaces with corners positioned at at least three speaker nodes of the plurality of speaker nodes and sides connecting pairs of corners and which are associated with speaker nodes located within a first sector and a first virtual speaker node located within a second sector opposite the first sector; removing from the first virtual surface arrangement any virtual surface that includes the first virtual speaker node as a corner; generating a second virtual surface arrangement comprising a second plurality of virtual surfaces with corners positioned at at least three speaker nodes of the plurality of speaker nodes and sides connecting pairs of corners and which are associated with speaker nodes located within the second sector and a second virtual speaker node located within the first sector; removing from the second virtual surface arrangement any virtual surface that includes the second virtual speaker node as a corner; and generating the virtual surface arrangement by combination of the first virtual surface arrangement and second virtual surface arrangement.

The defined virtual plane may be at least one of: a horizontal plane with an elevation of zero; a horizontal plane linking at least two or more loudspeaker or speaker nodes; a plane linking at least two or more loudspeaker or speaker nodes; and a plane defined by analysis of the at least one audio signal.

The speaker nodes may comprise at least one of: a physical loudspeaker; a virtual loudspeaker; and a binaural filter node.

The means for generating gains for the speaker nodes based on the determined virtual surface arrangement may further be configured for: generating at least one look up table of gains for the speaker nodes; and generating, based on a real time request comprising a direction associated with the at least one audio signal, gains for the speaker nodes.

The means for applying the gains to at least one audio signal, the at least one audio signal to be positioned within the three dimensional space may be configured for applying a vector base amplitude panning by applying the determined gains to the at least one audio signal to generate audio signals for the speaker nodes.

There is provided according to a fourth aspect an apparatus comprising at least one processor and at least one memory including a computer program code, the at least one memory and the computer program code configured to, with the at least one processor, cause the apparatus at least to: determine a non-overlapping sound surface arrangement, the sound surface arrangement comprising a plurality of sound surfaces with corners positioned at at least three speaker nodes of the plurality of speaker nodes and sides connecting pairs of corners configured to be non-intersecting with at least one defined virtual plane within the three dimensional space; generate gains for the speaker nodes based on the determined the sound surface arrangement; apply the gains to at least one audio signal, the at least one audio signal to be positioned within the three dimensional space.

The apparatus caused to determine a non-overlapping sound surface arrangement may be caused to: divide the speaker nodes into parts, wherein at least one part comprises speaker nodes located to one side or on the defined virtual plane, and at least one further part comprises speaker nodes located to the other side or on the defined virtual plane; determine sound surface edges for the at least one part and sound surface edges for the at least one further part; combine the sound surface edges for the at least one part and the sound surface edges for the at least one further part to generate the plurality of sound surfaces and therefore determine the non-overlapping sound surface arrangement.

The apparatus caused to divide the loudspeaker or speaker nodes into parts may be caused to divide the speaker nodes to an additional part comprising speaker nodes located on or close to the defined virtual plane, wherein the apparatus caused to determine the sound surface edges for the at least one part may be further caused to virtually connect speaker nodes for the at least one part comprising loudspeaker or speaker nodes located on or close to the defined virtual plane.

The apparatus caused to determine the at least one sound surface edges may be further caused to: determine candidate sound surface edges based on selecting pairs of speaker nodes; and process the candidate sound surface edges to determine the sound surface edges.

The apparatus caused to process the candidate sound surface edges to determine the sound surface edges may be further caused to: select one of the candidate sound surface edges until all of the candidate sound surface edges are selected; discard the one of the candidate sound surface edges when the one of the candidate sound surface edges crosses the defined virtual plane; discard the one of the candidate sound surface edges when the one of the candidate sound surface edges has any speaker node substantially behind, with respect to a defined observation point, the one of the candidate sound surface edges;

determine whether the one of the candidate sound surface edges intersect with at least one previous candidate sound surface edge and discard the at least one previous candidate sound surface edge when the previous candidate sound surface edge was longer and otherwise discard the one of the candidate sound surface edges.

The apparatus caused to determine whether the one of the candidate sound surface edges intersect with at least one previous candidate sound surface edge and discard the at least one previous candidate sound surface edge when the previous candidate sound surface edge was longer and otherwise discard the one of the candidate sound surface edges may be caused to apply at least one weighting to a length of one or other of the candidate sound surface edges and/or previous candidate sound surface edge prior to a comparison.

The apparatus may be further caused to add at least one virtual speaker node at a defined location.

The apparatus may be caused to perform at least one of: add a virtual speaker node directly at the top of a sphere defined by the speaker nodes; add a virtual speaker node directly at the bottom of a sphere defined by the speaker nodes; and add at least one virtual speaker node where speaker nodes are determined to be sparse.

The apparatus may be further caused to move at least one speaker node to the defined virtual plane when the at least one speaker node is within a defined threshold distance from the defined virtual plane.

The apparatus may be further caused to remove at least one speaker node when the at least one speaker node is within a defined threshold distance of at least one further speaker node.

The apparatus may be further caused to merge at least two speaker nodes when the at least two speaker nodes are within a defined threshold distance of each other.

The apparatus caused to determine a non-overlapping sound surface arrangement may be caused to: generate a first arrangement where for at least one sound surface the corners are associated with adjacent speaker nodes; analyse the first arrangement to determine whether at least one virtual edge of the at least one sound surface intersects with the defined virtual plane; and remove or redefine the at least one sound surface based on determining the at least one virtual edge of the first arrangement intersects with the defined virtual plane.

The apparatus caused to determine a non-overlapping sound surface arrangement may be caused to: define sectors of the non-overlapping sound surface arrangement either side of the defined virtual plane; generate a first sound surface arrangement comprising a first plurality of sound surfaces with corners positioned at at least three speaker nodes of the plurality of speaker nodes and sides connecting pairs of corners and which are associated with speaker nodes located within a first sector and a first virtual speaker node located within a second sector opposite the first sector; remove from the first sound surface arrangement any sound surface that includes the first virtual speaker node as a corner; generate a second sound surface arrangement comprising a second plurality of sound surfaces with corners positioned at at least three speaker nodes of the plurality of speaker nodes and sides connecting pairs of corners and which are associated with speaker nodes located within the second sector and a second virtual speaker node located within the first sector; remove from the second sound surface arrangement any sound surface that includes the second virtual speaker node as a corner; and generate the sound surface arrangement by combination of the first sound surface arrangement and second sound surface arrangement.

The defined virtual plane may be at least one of: a horizontal plane with an elevation of zero; a horizontal plane linking at least two or more loudspeaker or speaker nodes; a plane linking at least two or more loudspeaker or speaker nodes; and a plane defined by analysis of the at least one audio signal.

The speaker nodes may comprise at least one of: a physical loudspeaker; a virtual loudspeaker; and a binaural filter node.

The apparatus caused to generate gains for the speaker nodes based on the determined sound surface arrangement may be further caused to: generate at least one look up table of gains for the speaker nodes; and generate, based on a real time request comprising a direction associated with the at least one audio signal, gains for the speaker nodes.

The apparatus caused to apply the gains to at least one audio signal, the at least one audio signal to be positioned within the three dimensional space may be caused to apply a vector base amplitude panning by applying the determined gains to the at least one audio signal to generate audio signals for the speaker nodes.

According to a fifth aspect there is provided a method comprising: determining a non-overlapping sound surface arrangement, the sound surface arrangement comprising a plurality of sound surfaces with corners positioned at at least three speaker nodes of the plurality of speaker nodes and sides connecting pairs of corners configured to be non-intersecting with at least one defined virtual plane within the three dimensional space; generating gains for the speaker nodes based on the determined the sound surface arrangement; applying the gains to at least one audio signal, the at least one audio signal to be positioned within the three dimensional space.

Determining a non-overlapping sound surface arrangement may comprise: dividing the speaker nodes into parts, wherein at least one part comprises speaker nodes located to one side or on the defined virtual plane, and at least one further part comprises speaker nodes located to the other side or on the defined virtual plane; determining sound surface edges for the at least one part and sound surface edges for the at least one further part; combining the sound surface edges for the at least one part and the sound surface edges for the at least one further part to generate the plurality of sound surfaces and therefore determining the non-overlapping sound surface arrangement.

Dividing the loudspeaker or speaker nodes into parts may comprise dividing the speaker nodes to an additional part comprising speaker nodes located on or close to the defined virtual plane, wherein determining the sound surface edges for the at least one part may comprise virtually connecting speaker nodes for the at least one part comprising loudspeaker or speaker nodes located on or close to the defined virtual plane.

Determining the at least one sound surface edges may comprise: determining candidate sound surface edges based on selecting pairs of speaker nodes; and processing the candidate sound surface edges to determine the sound surface edges.

Processing the candidate sound surface edges to determine the sound surface edges may further comprise: selecting one of the candidate sound surface edges until all of the candidate sound surface edges are selected; discarding the one of the candidate sound surface edges when the one of the candidate sound surface edges crosses the defined virtual plane; discarding the one of the candidate sound surface edges when the one of the candidate sound surface edges has any speaker node substantially behind, with respect to a defined observation point, the one of the candidate sound surface edges; determining whether the one of the candidate sound surface edges intersect with at least one previous candidate sound surface edge and discarding the at least one previous candidate sound surface edge when the previous candidate sound surface edge was longer and otherwise discarding the one of the candidate sound surface edges.

Determining whether the one of the candidate sound surface edges intersect with at least one previous candidate sound surface edge and discarding the at least one previous candidate sound surface edge when the previous candidate sound surface edge was longer and otherwise discarding the one of the candidate sound surface edges may comprise applying at least one weighting to a length of one or other of the candidate sound surface edges and/or previous candidate sound surface edge prior to a comparison.

The method may comprise adding at least one virtual speaker node at a defined location.

The method may comprise performing at least one of: adding a virtual speaker node directly at the top of a sphere defined by the speaker nodes; adding a virtual speaker node directly at the bottom of a sphere defined by the speaker nodes; and adding at least one virtual speaker node where speaker nodes are determined to be sparse.

The method may further comprise moving at least one speaker node to the defined virtual plane when the at least one speaker node is within a defined threshold distance from the defined virtual plane.

The method may further comprise removing at least one speaker node when the at least one speaker node is within a defined threshold distance of at least one further speaker node.

The method may further comprise merging at least two speaker nodes when the at least two speaker nodes are within a defined threshold distance of each other.

Determining a non-overlapping sound surface arrangement may comprise: generating a first arrangement where for at least one sound surface the corners are associated with adjacent speaker nodes; analysing the first arrangement to determine whether at least one virtual edge of the at least one sound surface intersects with the defined virtual plane; and removing or redefining the at least one sound surface based on determining the at least one virtual edge of the first arrangement intersects with the defined virtual plane.

Determining a non-overlapping sound surface arrangement may comprise: defining sectors of the non-overlapping sound surface arrangement either side of the defined virtual plane; generating a first sound surface arrangement comprising a first plurality of sound surfaces with corners positioned at at least three speaker nodes of the plurality of speaker nodes and sides connecting pairs of corners and which are associated with speaker nodes located within a first sector and a first virtual speaker node located within a second sector opposite the first sector; removing from the first sound surface arrangement any sound surface that includes the first virtual speaker node as a corner; generating a second sound surface arrangement comprising a second plurality of sound surfaces with corners positioned at at least three speaker nodes of the plurality of speaker nodes and sides connecting pairs of corners and which are associated with speaker nodes located within the second sector and a second virtual speaker node located within the first sector; removing from the second sound surface arrangement any sound surface that includes the second virtual speaker node as a corner; and generating the sound surface arrangement by combination of the first sound surface arrangement and second sound surface arrangement.

The defined virtual plane may be at least one of: a horizontal plane with an elevation of zero; a horizontal plane linking at least two or more loudspeaker or speaker nodes; a plane linking at least two or more loudspeaker or speaker nodes; and a plane defined by analysis of the at least one audio signal.

The speaker nodes may comprise at least one of: a physical loudspeaker; a virtual loudspeaker; and a binaural filter node.

Generating gains for the speaker nodes based on the determined sound surface arrangement may further comprise: generating at least one look up table of gains for the speaker nodes; and generating, based on a real time request comprising a direction associated with the at least one audio signal, gains for the speaker nodes.

Applying the gains to at least one audio signal, the at least one audio signal to be positioned within the three dimensional space may comprise applying a vector base amplitude panning by applying the determined gains to the at least one audio signal to generate audio signals for the speaker nodes.

According to a sixth aspect there is provided an apparatus comprising means for: determining a non-overlapping sound surface arrangement, the sound surface arrangement comprising a plurality of sound surfaces with corners positioned at at least three speaker nodes of the plurality of speaker nodes and sides connecting pairs of corners configured to be non-intersecting with at least one defined virtual plane within the three dimensional space; generating gains for the speaker nodes based on the determined the sound surface arrangement; applying the gains to at least one audio signal, the at least one audio signal to be positioned within the three dimensional space.

The means for determining a non-overlapping sound surface arrangement may be configured for: dividing the speaker nodes into parts, wherein at least one part comprises speaker nodes located to one side or on the defined virtual plane, and at least one further part comprises speaker nodes located to the other side or on the defined virtual plane; determining sound surface edges for the at least one part and sound surface edges for the at least one further part; combining the sound surface edges for the at least one part and the sound surface edges for the at least one further part to generate the plurality of sound surfaces and therefore determining the non-overlapping sound surface arrangement.

The means for dividing the loudspeaker or speaker nodes into parts may be configured for dividing the speaker nodes to an additional part comprising speaker nodes located on or close to the defined virtual plane, wherein the means for determining the sound surface edges for the at least one part may be configured for virtually connecting speaker nodes for the at least one part comprising loudspeaker or speaker nodes located on or close to the defined virtual plane.

The means for determining the at least one sound surface edges may be configured for: determining candidate sound surface edges based on selecting pairs of speaker nodes; and processing the candidate sound surface edges to determine the sound surface edges.

The means for processing the candidate sound surface edges to determine the sound surface edges may further be configured for: selecting one of the candidate sound surface edges until all of the candidate sound surface edges are selected; discarding the one of the candidate sound surface edges when the one of the candidate sound surface edges crosses the defined virtual plane; discarding the one of the candidate sound surface edges when the one of the candidate sound surface edges has any speaker node substantially behind, with respect to a defined observation point, the one of the candidate sound surface edges; determining whether the one of the candidate sound surface edges intersect with at least one previous candidate sound surface edge and discarding the at least one previous candidate sound surface edge when the previous candidate sound surface edge was longer and otherwise discarding the one of the candidate sound surface edges.

The means for determining whether the one of the candidate sound surface edges intersect with at least one previous candidate sound surface edge and discarding the at least one previous candidate sound surface edge when the previous candidate sound surface edge was longer and otherwise discarding the one of the candidate sound surface edges may be configured for applying at least one weighting to a length of one or other of the candidate sound surface edges and/or previous candidate sound surface edge prior to a comparison.

The means for may be configured for adding at least one virtual speaker node at a defined location.

The means for may be configured for performing at least one of: adding a virtual speaker node directly at the top of a sphere defined by the speaker nodes; adding a virtual speaker node directly at the bottom of a sphere defined by the speaker nodes; and adding at least one virtual speaker node where speaker nodes are determined to be sparse.

The means for may be configured for moving at least one speaker node to the defined virtual plane when the at least one speaker node is within a defined threshold distance from the defined virtual plane.

The means for may be configured for removing at least one speaker node when the at least one speaker node is within a defined threshold distance of at least one further speaker node.

The means for may be configured for merging at least two speaker nodes when the at least two speaker nodes are within a defined threshold distance of each other.

The means for determining a non-overlapping sound surface arrangement may be configured for: generating a first arrangement where for at least one sound surface the corners are associated with adjacent speaker nodes; analysing the first arrangement to determine whether at least one virtual edge of the at least one sound surface intersects with the defined virtual plane; and removing or redefining the at least one sound surface based on determining the at least one virtual edge of the first arrangement intersects with the defined virtual plane.

The means for determining a non-overlapping sound surface arrangement may be configured for: defining sectors of the non-overlapping sound surface arrangement either side of the defined virtual plane; generating a first sound surface arrangement comprising a first plurality of sound surfaces with corners positioned at at least three speaker nodes of the plurality of speaker nodes and sides connecting pairs of corners and which are associated with speaker nodes located within a first sector and a first virtual speaker node located within a second sector opposite the first sector; removing from the first sound surface arrangement any sound surface that includes the first virtual speaker node as a corner; generating a second sound surface arrangement comprising a second plurality of sound surfaces with corners positioned at at least three speaker nodes of the plurality of speaker nodes and sides connecting pairs of corners and which are associated with speaker nodes located within the second sector and a second virtual speaker node located within the first sector; removing from the second sound surface arrangement any sound surface that includes the second virtual speaker node as a corner; and generating the sound surface arrangement by combination of the first sound surface arrangement and second sound surface arrangement.

The defined virtual plane may be at least one of: a horizontal plane with an elevation of zero; a horizontal plane linking at least two or more loudspeaker or speaker nodes; a plane linking at least two or more loudspeaker or speaker nodes; and a plane defined by analysis of the at least one audio signal.

The speaker nodes may comprise at least one of: a physical loudspeaker; a virtual loudspeaker; and a binaural filter node.

The means for generating gains for the speaker nodes based on the determined sound surface arrangement may further be configured for: generating at least one look up table of gains for the speaker nodes; and generating, based on a real time request comprising a direction associated with the at least one audio signal, gains for the speaker nodes.

The means for applying the gains to at least one audio signal, the at least one audio signal to be positioned within the three dimensional space may be configured for applying a vector base amplitude panning by applying the determined gains to the at least one audio signal to generate audio signals for the speaker nodes.

A non-transitory computer readable medium comprising program instructions for causing an apparatus to perform the method as described above. An apparatus configured to perform the actions of the method as described above.

A computer program comprising program instructions for causing a computer to perform the method as described above.

A computer program product stored on a medium may cause an apparatus to perform the method as described herein.

An electronic device may comprise apparatus as described herein.

A chipset may comprise apparatus as described herein.

Embodiments of the present application aim to address problems associated with the state of the art.

SUMMARY OF THE FIGURES

For a better understanding of the present application, reference will now be made by way of example to the accompanying drawings in which:

FIGS. 3a and 3b shows schematically a source panning using two different triangulations;

FIG. 5e shows a flow diagram a method of operating the further example of a vector base amplitude panning triangulation generator as shown in FIG. 5d according to some embodiments;

FIG. 8b shows a flow diagram of an example content based plane determination method according to some embodiments;

FIG. 9 shows schematically content adaptation as part of generating vector base amplitude panning triangulation according to some embodiments;

EMBODIMENTS OF THE APPLICATION

The following describes in further detail suitable apparatus and possible mechanisms for the provision of adaptation of vector base amplitude panning (VBAP).

As discussed previously VBAP is based on automatically triangulating the loudspeaker setup, selecting an appropriate active triangle based on the direction (such that for a given direction three loudspeakers are selected which form a triangle where the given direction falls in), and computing gains for the three loudspeakers forming the particular triangle (or generally the particular polygon). The 'active' triangles may be generalized as being a virtual surface arrangement comprising virtual surfaces with corners located at loudspeaker or speaker node locations. Furthermore although some embodiments hereafter describe the generation of virtual surfaces as triangle surfaces the same methods and apparatus may be employed for any suitable polygon surface.

In other words some embodiments as described hereafter are caused to determine a non-overlapping arrangement of sound surfaces, the arrangement of sound surfaces comprising a plurality of sound surfaces generated by having at least three speaker nodes of a plurality of speaker nodes, wherein each of the at least three speaker nodes is positioned in the three dimensional space in order to form a corner of a sound surface where any two sides of the sound surface in connected to a corner of the sound surface such that at least one defined sound plane does not intersect with the any two sides of the sound surface. A virtual surface as described hereafter in the examples may therefore be understood to be a sound surface represented within the 3D space defined by the speaker nodes.

In a practical implementation, VBAP gains (for each azimuth and elevation) and the loudspeaker triplets (for each azimuth and elevation) are typically pre-formulated into a lookup table stored in the memory. A real-time system then performs the amplitude panning by finding from the memory the appropriate loudspeaker triplet for the desired panning direction, and the gains for these loudspeakers corresponding to the desired panning direction.

The first stage of VBAP is division of the 3D loudspeaker setup into triangles. An example 'active' triangle is shown in FIG. 1.

Figure 1:
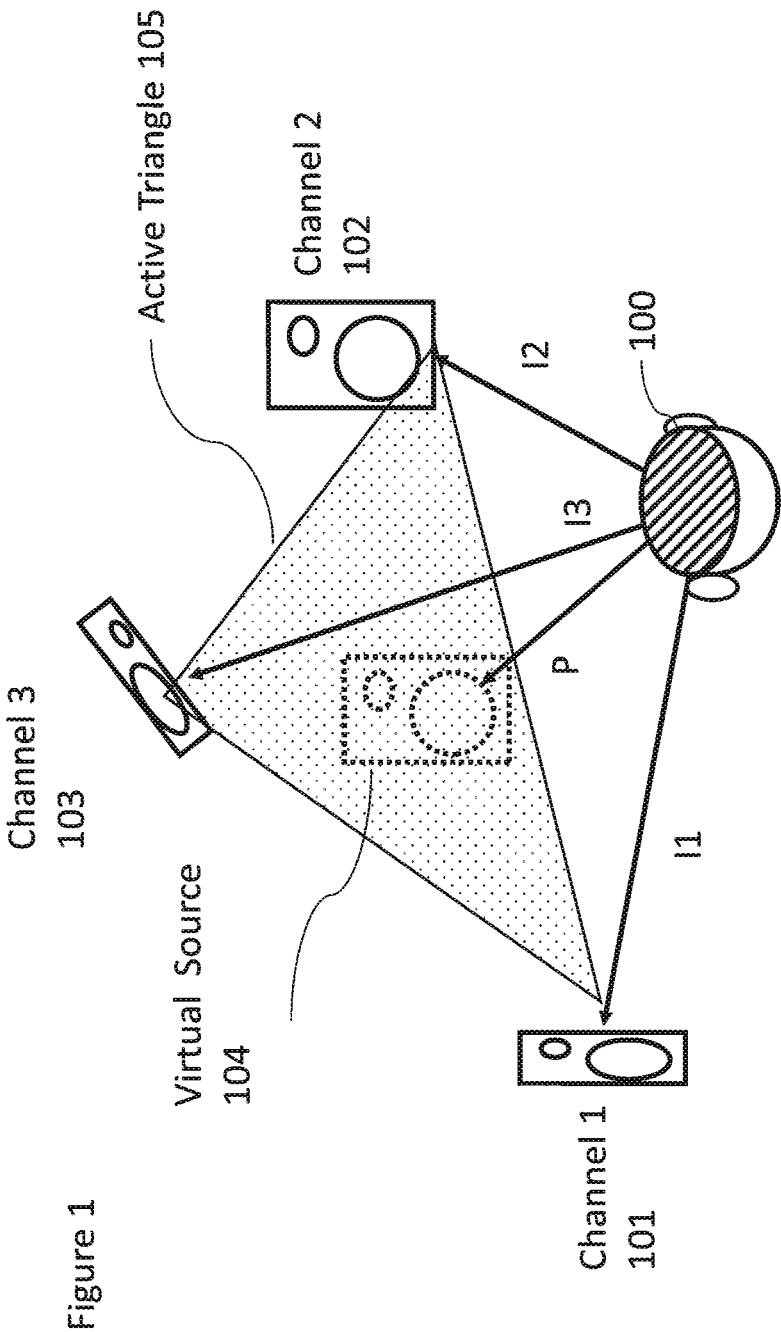
FIG. 1 shows schematically a vector base amplitude panning example comprising a loudspeaker triplet and active triangle.

FIG. 1 shows for example three loudspeakers, channel 1 101 located at the direction of unit vector $I_1$, channel 2 102 located at the direction of unit vector $I_2$ and channel 3 101 located at the direction of unit vector $I_3$. These vectors are defined relative to the listener 100 at a point of origin and show the defined active triangle 105 defined by the three loudspeakers. Furthermore is shown a virtual source 104 located at the direction of unit vector p relative to the listener 100 within the active triangle 105.

The next stage is to formulate panning gains corresponding to the panning directions.

The vector base amplitude panning refers to the method where the three unit vectors $I_1$, $I_2$, $I_3$ (the vector base) are assumed from the point of origin to the positions of the three loudspeakers forming the triangle where the panning direction falls in as shown in FIG. 1.

The panning gains for the three loudspeakers are determined such that these three unit vectors are weighted such that their weighted sum vector points towards the desired amplitude panning direction. This can be solved as follows. A column unit vector p is formulated pointing towards the desired amplitude panning direction, and a vector g containing the amplitude panning gains can be solved by a matrix multiplication $$g^T = p^T \begin{bmatrix} I_1^T \\ I_2^T \\ I_3^T \end{bmatrix}^{-1}.$$

where $^{-1}$ denotes the matrix inverse. After formulating gains g, their overall level is normalized such that for the final gains the energy sum $g^T g = 1$;

In order to perform the amplitude panning, VBAP needs to first triangulate the 3D loudspeaker setup. There is no single solution to the generation of the triangulation and the loudspeaker setup can be triangulated in many ways. In typical VBAP, the solution is to try to find triangles of minimal size (no loudspeakers inside the triangles and sides having as equal length as possible). In a general case, this is a valid approach, as it treats auditory objects in any direction equally, and tries to minimize the distances to the loudspeakers that are being used to create the auditory object at that direction.

Another computationally fast method for the triangulation is to generate a convex hull as a function of the data points determined by the loudspeaker angles. This is also a generic approach that treats all directions and data points equally.

Perceptual spatial accuracy of amplitude panning, including VBAP, is known to be more robust when the panning is performed with loudspeakers being substantially on the horizontal axis than the vertical axis. The reason for this is that the binaural cues for elevation perception relate mostly to the sound spectrum (which is not well reproduced with amplitude panning), while the binaural cues for azimuth perception relate mostly to the inter-aural level and time differences (which are better reproduced with amplitude panning).

The embodiments as discussed hereafter therefore perform the triangulation such that also the differing performance in the horizontal and vertical axes are taken into account. Additionally, as a majority of the auditory objects are typically placed on the horizontal plane (or near it) the placement of triangle edges on the horizontal axis are expected to increase reproduction accuracy. The plane, is a virtual plane and may be localized (in other words not be infinite or semi-infinite but is bounded).

Figure 2:
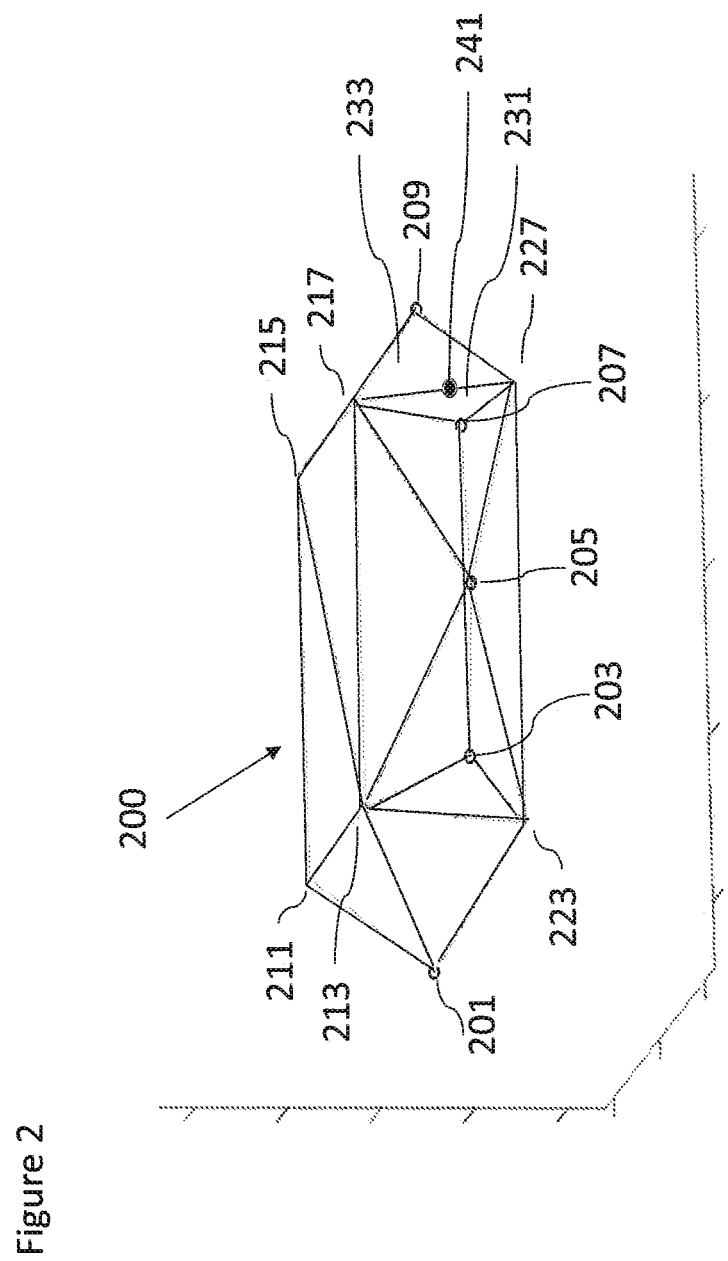
FIG. 2 shows schematically a vector base amplitude panning triangulation.

Typically, the loudspeaker setups are not equally distributed. Instead, there are typically more loudspeakers in the horizontal plane. For example the common 7.1 setup with only horizontal loudspeakers (and low-frequency effects (LFE)) is often used as a basis, and only a few loudspeakers with elevation are added to that setup. A common example of that approach is the 7.1.4 which contains 4 loudspeakers above the horizontal plane. In the following examples, full 3D setups are formed (loudspeakers both above and below the horizontal plane) by extending the common 7.1.4 setup by adding 4 loudspeakers also below the horizontal plane, resulting in the following positions for the loudspeakers:

Elevation 0 degrees, azimuth 0, ±30, ±90, and ±150 degrees, which may be defined as (0,0) 205, (30,0) 207, (90,0) 209, (150,0) not seen in FIG. 2, (−150,0) not seen in FIG. 2, (−90,0) 201, (−30,0) 203.

Elevation 30 degrees, azimuth ±45 and ±135 degrees, which may be defined as (45,30) 217, (135,30) 215, (−135,30) 211 and (−45,30) 213.

Elevation −20 degrees, azimuth ±45 and ±135 degrees, which may be defined as (45,−20) 227, (135,−20) not seen in FIG. 2, (−135,−20) not seen in FIG. 2 and (−45,−20) 223.

This example loudspeaker setup is denoted as 7.1.8.

With such a setup, as illustrated in FIG. 2, the default VBAP triangulation creates one triangle 231 between the loudspeakers at (azimuth, elevation) pairs (30, 0) 207, (45,30) 217, and (45,−20) 227 degrees. With such a triangulation, an auditory object at (30, 0) degrees would be reproduced with the loudspeaker at (30, 0) 207 degrees, whereas an auditory object at (45,0) degrees, shown in FIG. 2 as reference 241, would be reproduced with the loudspeakers at (45,30) 217 and (45,−20) 227 degrees. The perception of these two would be very different (the former would be perceived as a point-like source, whereas the latter would be perceived as a vertically spread source). As a result, an auditory object rotating in the horizontal plane would sound very different at different directions.

This effect is shown for example in FIGS. 3a and 3b. In FIG. 3a the loudspeakers 301, 303 and 305 are used in a VBAP method to represent a 'point' source located on the horizontal plane but as shown in FIG. 3a the output audio source 302 appears smeared in the vertical plane because of the effect of the speakers above and below the horizontal plane. In FIG. 3b the loudspeakers 311, 313 and 315 are used to represent a 'point' source also located on the horizontal plane but as shown in FIG. 3b the output audio source 312 is not smeared in the plane despite the speakers left and right of the source.

The vertical panning fails with respect to the horizontal panning for two following reasons:

Comb filtering. Amplitude panning refers to reproducing the same signal at (at least) two directions. When the panning occurs in the vertical axis, regardless of the horizontal rotation of the listener, the relative delays for the sounds from the two loudspeakers reaching the two ears are very similar, and both ears receive the same comb filter effect. This emphasizes the perceived spectral bias due to the panning to the reproduced sound, which in turn typically reduces the perceived audio quality. Horizontal amplitude panning, on the other hand, has in average a larger mutual variation of the comb filters at the left and right ears, thus mitigating the phenomenon. Furthermore, the head shadowing reduces the relative levels of the signals reaching the left and right ears, thus also reducing the magnitude of the comb filter effect.

Localization. In amplitude panning on the vertical axis, it has been observed that different frequencies are localized at significantly different elevations. In other words, it depends on the spectral content of the signal at which elevation the sound is perceived. For substantially wide-band signals the source is perceived as spread or ambiguous over the panning arc determined by the two vertically loudspeakers.

The embodiments thus described hereafter relate to 3D spatial audio reproduction with multi-channel loudspeaker (virtual or otherwise) setups to produce an automatic adaptation of the vector base amplitude panning (VBAP) for arbitrary loudspeaker setups. Furthermore, the embodiments describe a triangulation scheme for VBAP that avoids triangles crossing the horizontal plane and thus provides better audio quality for auditory objects placed on the horizontal plane.

Figure 4:
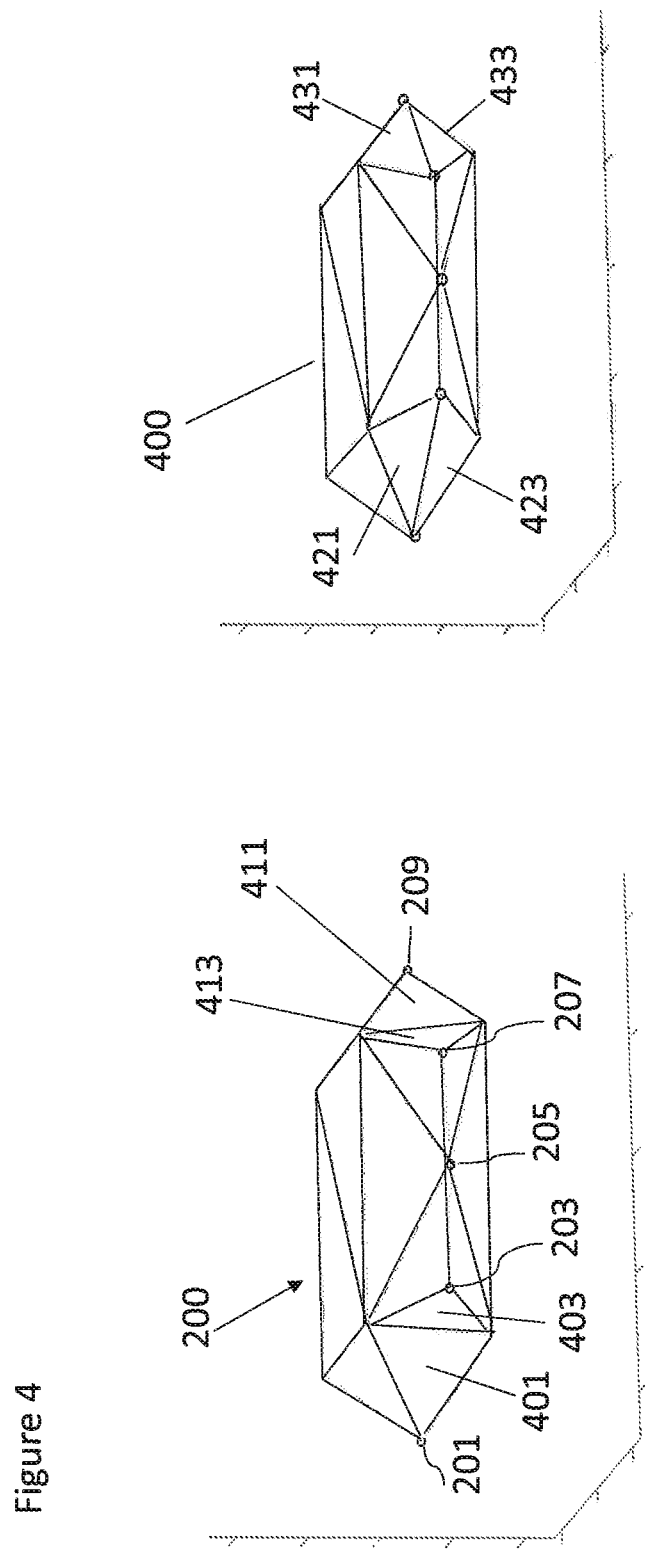
FIG. 4 shows schematically a vector base amplitude panning triangulation and a further vector base amplitude panning triangulation produced using methods according to some embodiments.

An example of such a triangular scheme is shown in FIG. 4. The left hand side of FIG. 4 shows the triangulation shown in FIG. 2 for the example 7.1.8 system which includes the triangles 401, 403 and 411 and 413 which cross the horizontal plane and create vertical panning areas for any sources inside these triangles whereas the right hand side of FIG. 4 shows an example triangulation produced by embodiments wherein the areas covered by triangles 401 and 403 are now represented by triangles 421 (with vertices/corners defined by loudspeakers (−90,0) 201, (−30,0) 203 and (−45, 30) 213) and 423 (with vertices/corners defined by loudspeakers (−90,0) 201, (−30,0) 203 and (−45,−30) 223). Similarly the areas covered by triangles 411 and 413 are now represented by triangles 431 (with vertices/corners defined by loudspeakers (90,0) 209, (30,0) 207 and (45,30) 217) and 433 (with vertices/corners defined by loudspeakers (90,0) 209, (30,0) 207 and (45,−30) 227).

In some embodiments the apparatus and methods further describe a triangulation which does not cross one or more horizontal loudspeaker arrangements above or below the horizontal plane. This enables optimizing the rendering for objects moving along circular trajectories above or beyond the horizontal plane.

In some further embodiments the apparatus and methods further describe defining or designing triangulations which do not cross arbitrary planes, such as a plane oriented vertically. This enables optimal rendering for objects with arbitrary movement trajectories.

The embodiments as described herein also enable making the selection of the triangulation method adaptively based on content. In such embodiments the apparatus and methods determine spatial metadata or object position metadata, determine some characteristics of movement from the metadata, and select the used triangulation accordingly.

It is understood that such embodiments are applicable for triangulating physical and virtual loudspeakers. Furthermore, the following embodiments may be beneficial when triangulating binaural filters used for headphone virtualization.

The auditory object placement in VBAP is performed in three stages
1) Triangulate the loudspeaker setup.
2) Based on the direction parameter, select a triangle and compute the gains for the loudspeakers of the triangle.
3) Apply the gains to the audio signal to be positioned.

The stages 1) and 2) may be performed during an offline or initialization stage, and the result of which is a lookup table of gains and loudspeaker triplet indices that can be effectively utilized in real-time processing performing stage 3).

The embodiments described hereafter concern primarily the operations of stage 1.

Figure 5A:
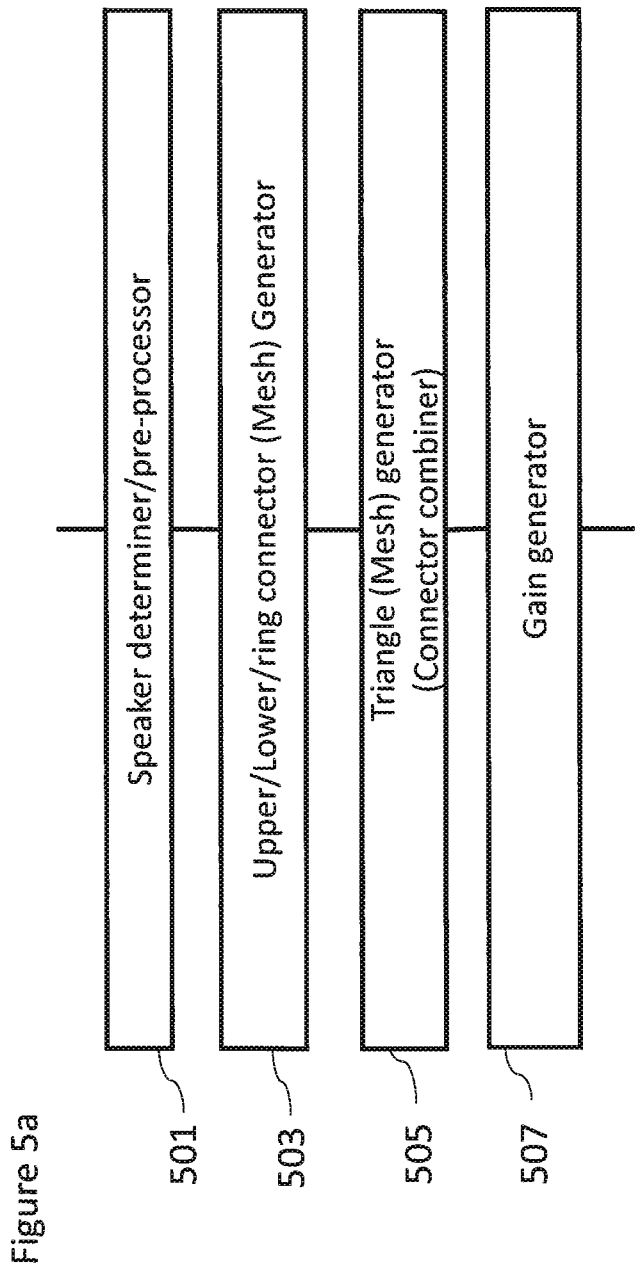
FIG. 5a shows schematically an example vector base amplitude panning triangulation generator according to some embodiments.
Figure 5B:
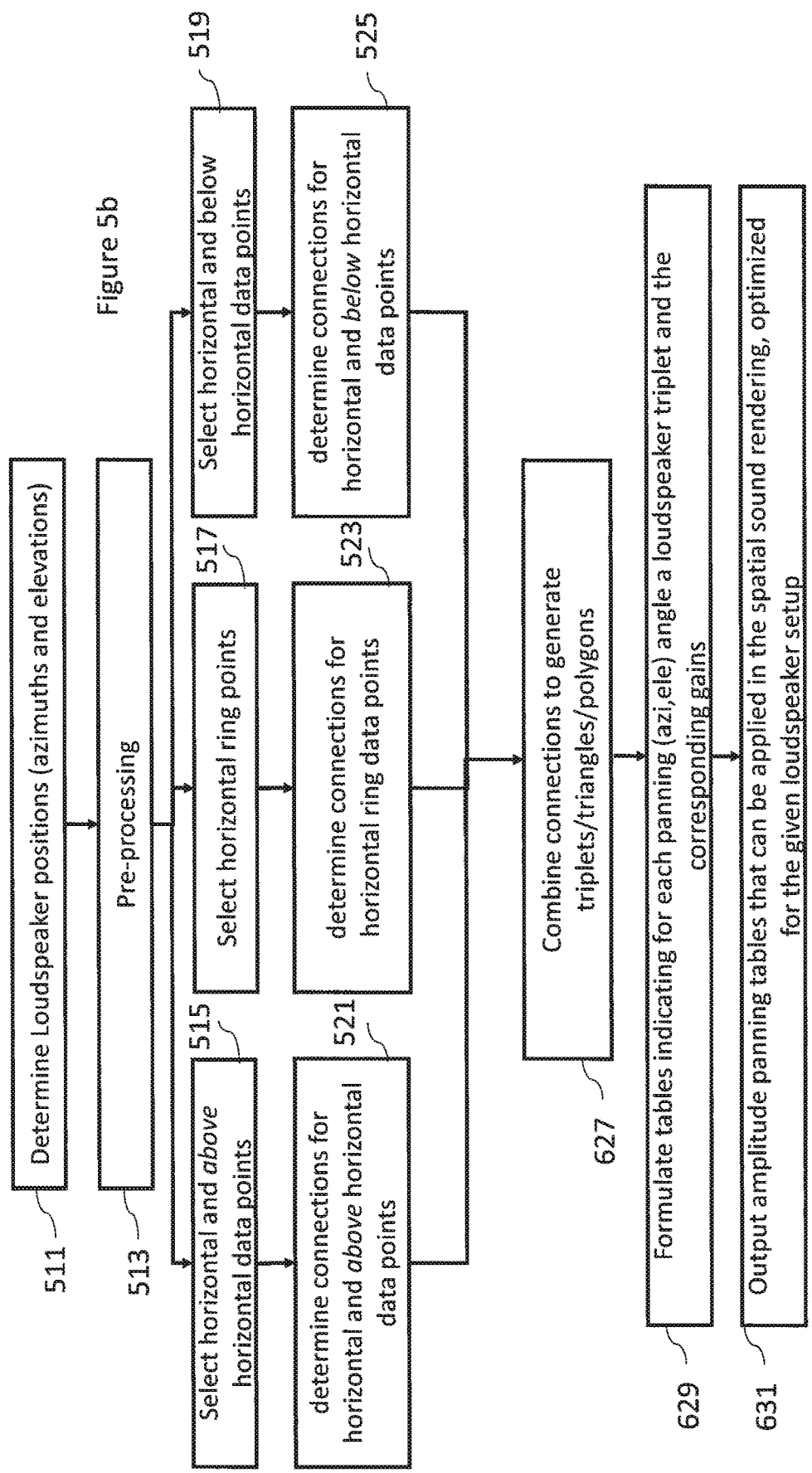
FIG. 5b shows a flow diagram of an example method of operating the example of a vector base amplitude panning triangulation generator as shown in FIG. 5a according to some embodiments.
Figure 5C:
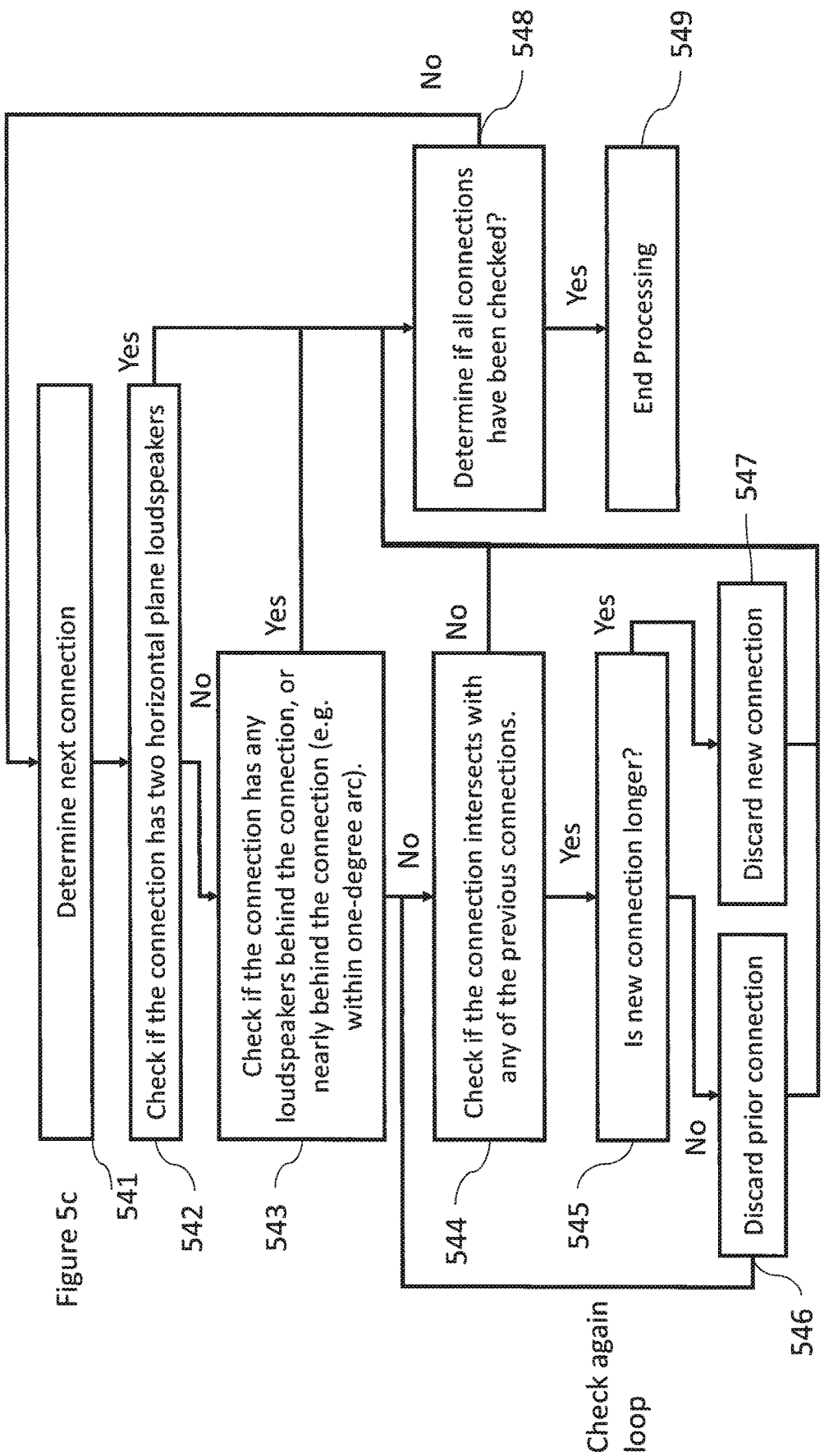
FIG. 5c shows a flow diagram of an example method of generating connectors as implemented in FIG. 5b according to some embodiments.

With respect to FIGS. 5a to 5c an example apparatus view and example flow diagrams of the operations according to some embodiments are shown. In the following example the 'no-cross' plane is the horizontal plane but in some embodiments there may be other planes which are defined as 'no-cross' planes and the following method and apparatus may be modified to perform similar operations to take this into account.

In some embodiments the example apparatus comprises a speaker determiner/pre-processor 501. The speaker determiner/pre-processor is configured to determine the loudspeaker positions. In some embodiments the loudspeaker positions are provided as an input. They may be for example in a form of unit vectors, or in polar coordinates.

The operation of determining the loudspeaker positions is shown in FIG. 5b by step 511.

The speaker determiner/pre-processor 501 may receive the loudspeaker positions and furthermore may for example add virtual loudspeakers at some locations. For example, in some embodiments the speaker determiner/pre-processor 501 is configured to add a virtual loudspeaker directly at the top or at the bottom of the sphere. These additional virtual loudspeakers may be added for example where the input loudspeaker setup is sparse for a defined region.

After the process of formulating the panning gains, the virtual loudspeaker gains can be treated in several ways. In some embodiments these virtual loudspeaker panning gains are discarded. In some embodiments the virtual loudspeaker panning gains are distributed to the nearby loudspeakers. In some embodiments the panning gains relating to the top (or bottom) virtual loudspeaker are discarded if the maximum elevation (or inclination) of the actual loudspeakers is 20 degrees or less. In some embodiments a gain-distribution method is employed if the maximum elevation (or inclination) of the actual loudspeakers is more than 20 degrees. The gain distribution method may distribute the gain of the top (or bottom) virtual loudspeaker equally to all loudspeakers with a virtual connection to the top (or bottom) virtual loudspeaker.

In some embodiments the speaker determiner/pre-processor 501 is further configured to move the position information of one or more loudspeakers to the horizontal plane (or in general the no-cross plane). For example the speaker determiner/pre-processor 501 can be configured to determine that any loudspeakers within 5 degrees elevation (or inclination/declination) of the horizontal-plane are set to the horizontal-plane elevation. These loudspeakers may then be treated as a part of the horizontal ring.

In some embodiments the speaker determiner/pre-processor 501 is configured to remove some loudspeakers at the loudspeaker setup. For example, the speaker determiner/pre-processor 501 is configured to determine whether loudspeakers are very close, e.g. less than or equal to 5 degrees apart (it may not be necessary or preferable to use both loudspeakers for the amplitude panning). In such embodiments one of the determined loudspeakers may be discarded in the triangulation. Alternatively in some embodiments the speaker determiner/pre-processor 501 is configured to merge the two loudspeakers (e.g., both reproducing the same signal).

The operation of pre-processing is shown in FIG. 5b by step 513.

The example apparatus in some embodiments comprises an (upper-half/lower-half/horizontal-ring) connector generator 503. The connector generator 503 may receive the output from the speaker determiner/pre-processor 501.

The connector generator 503 may then be configured to divide the loudspeaker positions into three parts: Horizontal plane loudspeakers, upper half sphere (including horizontal), and bottom half sphere (including horizontal).

The operation of selecting horizontal and above loudspeaker positions is shown in FIG. 5b by step 515.

The operation of selecting horizontal ring positions is shown in FIG. 5b by step 517.

The operation of selecting horizontal and below loudspeaker positions is shown in FIG. 5b by step 519.

Having divided the loudspeaker positions into the three (or any suitable number of) parts connections between pairs of loudspeaker positions may be generated for each of the parts.

The connections for the horizontal plane loudspeakers are generated by connecting each loudspeaker to an adjacent loudspeaker in the horizontal plane.

The determining of connections for the horizontal ring data points (or positions) is shown in FIG. 5 by step 523.

The determining of connections for each hemi-sphere (the horizontal and below loudspeaker positions and the horizontal and above loudspeaker positions) may be determined.

The determining of connections for the horizontal ring and above horizontal data points (or positions) is shown in FIG. 5 by step 521.

The determining of connections for the horizontal ring and below horizontal data points (or positions) is shown in FIG. 5 by step 525.

An example of the operations for determining the connections for a hemi-sphere is shown in FIG. 5c and may employ the following algorithm:

Determine a next connection as shown in FIG. 5c by step 541.

Check if the connection has two horizontal plane loudspeakers as shown in FIG. 5c by step 542.

If the connection has two horizontal plane loudspeakers discard connection as shown in FIG. 5c by step 548 and then jump to step 549.

If the connection does not have two horizontal plane loudspeakers the connection is then checked to determine whether it has any loudspeakers behind the connection, or nearly behind the connection (e.g. within one-degree arc). This detection can be formulated by considering a line from the origin to each of the loudspeaker positions, and checking whether any of these lines intersects or nearly intersects with the connection as shown in FIG. 5c by step 543.

If the connection has any loudspeakers behind the connection, or nearly behind the connection then discard connection as shown in FIG. 5c by step 548 and then jump to step 549.

If the connection has no loudspeakers behind the connection, or nearly behind the connection then the connection is checked to determine whether the connection intersects with any of the previous connections. This detection can be formulated by studying the intersection of two planes. A plane is determined by two vectors from the origin to the two loudspeakers in a connection. If the plane intersection of two such planes (determined by two different connections) is within both connections then a crossing is detected. The checking of a connection to determine whether the connection intersects with any of the previous connections is shown in FIG. 5c by step 544. An intersection of two virtual surface edges may be interpreted as an apparent intersection from a defined observation point. In other words, if such a straight line from the defined observation point can be defined that crosses both virtual surface edges, then an intersection of these two virtual surface edges can be assumed. This means that the crossing (or intersection) can be detected, even if the edges (as lines) themselves may not cross in the 3D space.

When no intersection is found then the connection is kept and the method jumps to step 548

When an intersection is found then the new connection is checked to determine whether the new connection is longer than the prior compared connection as shown in FIG. 5c by step 545.

Where the new connection is longer than the prior compared connection then discard the new connection as shown in FIG. 5c by step 547 and jump to step 549.

Where the new connection is not longer than the prior compared connection then discard the prior connection as shown in FIG. 5c by step 546.

When one of the prior connections intersects and is longer than the new connection, then there can be other intersecting prior connections as well. Therefore, once a prior connection is discarded, the method may apply a check again loop to keep checking the new connection against all remaining prior connections. This is shown in FIG. 5c when the prior connection is discarded at block 546, then go back to block 544 to check intersections with remaining previous connections.

The checking is therefore stopped only if the
1) new connection is discarded, or
2) all connections are checked, and the new hasn't been discarded (even if some of the prior connections were).

The later condition (2) is the condition when the new connection is stored, and then the method proceeds to check the next new connection.

The connector determiner may then be configured to determine whether all connections have been checked as shown in FIG. 5c by step 548.

When all the connections have been checked then the processing ends as shown in FIG. 5c by step 549.

When at least some connections have to be checked then the next connection is selected in other words the method passes back to step 541.

In some embodiments the determination of connections may also have some weighting applied to the processing operations. For example, if some loudspeakers form a ring (e.g., a ring at a defined elevation), any connection crossing that ring could be weighted in step 545, for example, its length could be doubled for the comparison. As the result of such a procedure, at that certain elevation ring the loudspeaker connections at that elevation are preferred in the triangulation and thus also at the resulting amplitude panning.

In some embodiments any loudspeaker connection being more "vertical" than "horizontal" could be similarly weighted in step 545 (e.g., the length of the vertical connection could be doubled for the comparison), in order to prefer horizontal connections due to an expected better perceptual performance.

The example apparatus may furthermore comprise a triangle (mesh) generator (or connector combiner) 505. The triangle (mesh) generator (or connector combiner) 505 is configured to receive the determined connections from each part (of the complete space) and combine these to generate suitable triplets/triangles or more generally polygons as shown in FIG. 5b by step 527. This may be implemented in some embodiments by:

Finding all triangles that are formed by the determined connections; and

Storing only those triangles that do not have a loudspeaker within the triangle.

The example apparatus may further comprise a gain generator 507 configured to receive the output of the triangle (mesh) generator 505 and determine panning gain triplets and loudspeaker triplets. In some embodiments this may be performed as the generation of a look-up table or a real time calculation as shown in FIG. 5b by step 529.

The set of panning angles can, for example, be determined based on the accuracy of direction perception of human auditory system.

The gains may then be output as shown in FIG. 5b by step 531.

In some embodiments the method as discussed in the embodiments above may alternatively not generate the horizontal or otherwise defined plane connections separately, but could also simply not discard the horizontal plane connections at either of the top or bottom hemispheres.

Figure 5D:
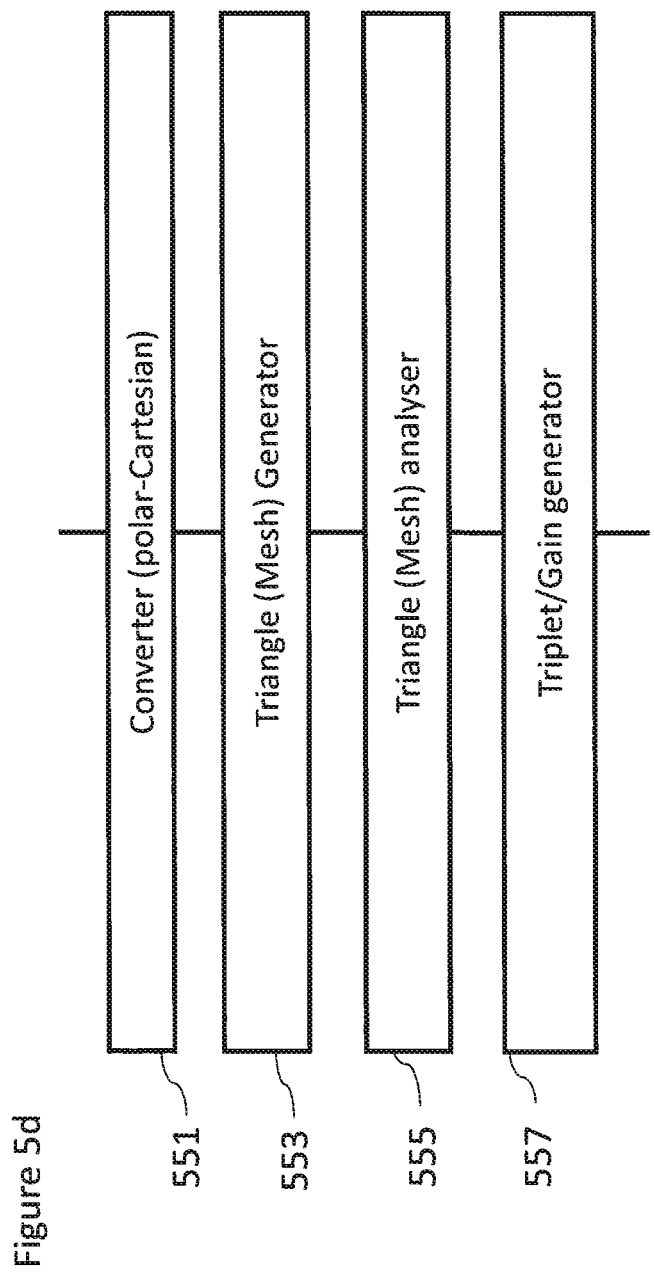
FIG. 5d shows schematically a further example of a vector base amplitude panning triangulation generator according to some embodiments.

With respect to FIGS. 5d and 5e a further example is shown by a schematic apparatus view and an example flow diagram of the operations according to some embodiments caused to modify the triangulation of the common VBAP.

In some embodiments the loudspeaker positions are determined as shown in FIG. 5d by step 561. As described earlier these loudspeakers may be physical or virtual loudspeakers. In the example shown herein the loudspeaker positions are defined in spherical coordinates, in other words with azimuth and elevation values.

In some embodiments a converter 551 or similar is caused to convert the loudspeaker angles (polar coordinates) into the points on a sphere (cartesian coordinates) as shown in FIG. 5e by step 563. In some embodiments where the loudspeaker positions are already defined in Cartesian coordinate form then the converter is optional and the operation may be missed.

In some embodiments a triangle or mesh generator 553 is configured to receive the output from the converter 551 and generate all possible triangles (or triplets) between the loudspeakers (or more generally the polygon edges which link the vertices located at the loudspeakers) as in common VBAP. In other words the triangles are formed between the loudspeakers as the vertices/corners as shown in FIG. 5e by step 565.

In some embodiments a triangle (or mesh) analyser 555 is configured to receive the output of the triangle or mesh generator 553. The triangle analyser 555 may be configured to determine triangles having edges that cross the horizontal plane. These may then be removed and/or replaced with triangles which do not cross the horizontal plane.

In other words the operation is one of identifying and removing any triangles with edges which cross the horizontal plane as shown in FIG. 5e by step 567.

Furthermore in some embodiments the analysis and optimization of the triangulation is continued (i.e., removal of triangles) according to any known method. This is shown in FIG. 5e by step 569.

The triplet/gain generator 557 is configured to receive the output of the triangle (mesh) analyser 555 and determine panning gain triplets and loudspeaker triplets. In some embodiments this may be performed as the generation of a look-up table or a real time calculation.

The operation of formulating (generating) amplitude panning tables indicating for a set of panning (azi,ele) angles a loudspeaker triplet and the corresponding gains is shown in FIG. 5e by step 571. The set of panning angles can, for example, be determined based on the accuracy of direction perception of human auditory system.

The operation of outputting the amplitude panning tables is shown in FIG. 5e by step 573.

Although the method and apparatus in FIGS. 5d and 5e describe an analysis of triangle with edges crossing the horizontal plane it is understood that the triangle analyser 555 and the resultant analysis operations may be performed to limit crossings of the triangles along any plane, not only the horizontal plane.

Figure 6A:
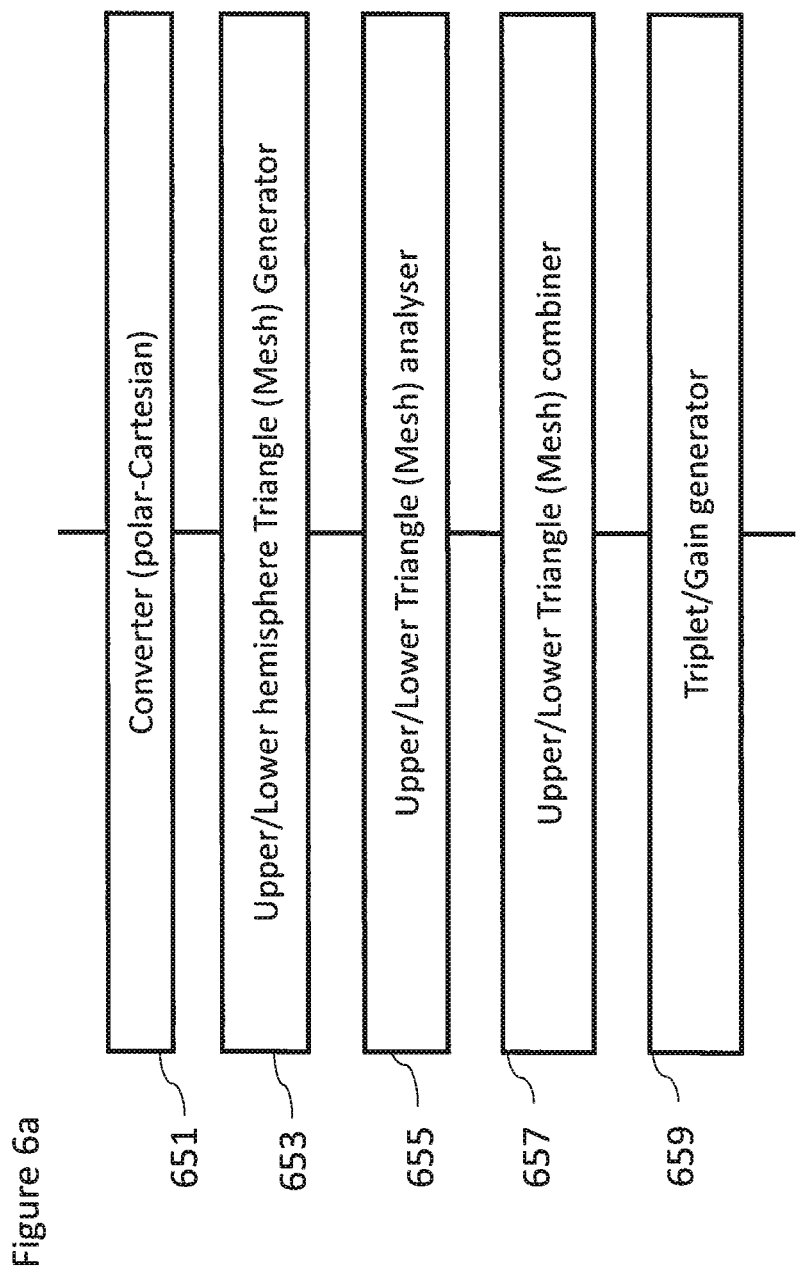
FIG. 6a shows schematically another example vector base amplitude panning triangulation generator according to some embodiments.
Figure 6B:
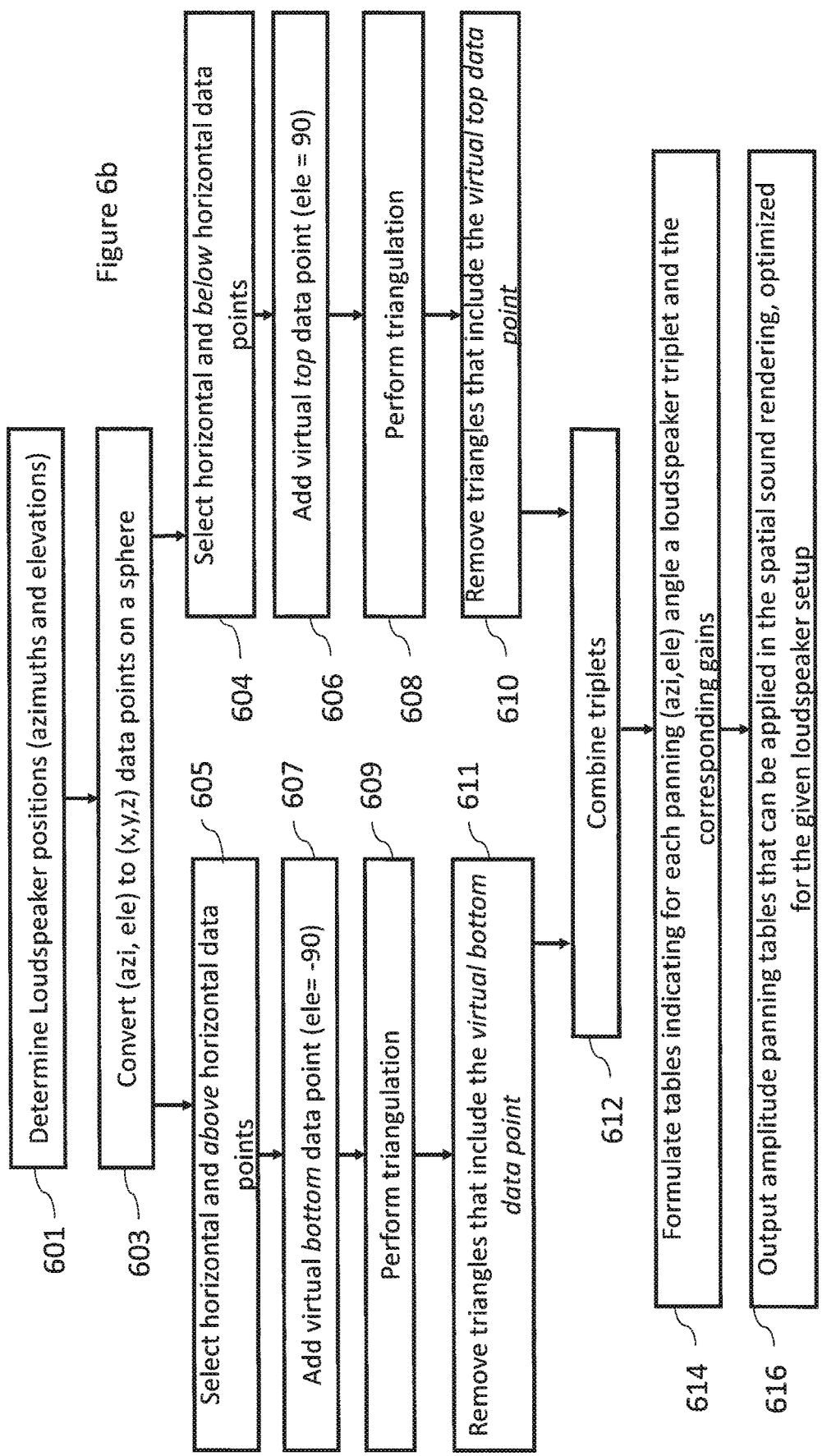
FIG. 6b shows a flow diagram of a method of operating the another example vector base amplitude panning triangulation generator as shown in FIG. 6a according to some embodiments.

With respect to FIGS. 6a and 6b another example is shown by a schematic apparatus view and an example flow diagram of the operations according to some embodiments caused to modify the triangulation of the common VBAP. These embodiments differ from the above embodiments wherein the space is divided into two hemi-spheres before calculating triangles for each hemi-sphere.

In some embodiments the loudspeaker positions are determined as shown in FIG. 6b by step 601. Similar to above these loudspeakers may be physical or virtual loudspeakers. In the example shown herein the loudspeaker positions are defined in spherical coordinates, in other words with azimuth and elevation values. In some embodiments a converter 651 or similar is caused to convert the loudspeaker angles (polar coordinates) into the points on a sphere (cartesian coordinates) as shown in FIG. 6b by step 603. In some embodiments where the loudspeaker positions are already defined in Cartesian coordinate form then the converter is optional and the operation may be missed.

In some embodiments an upper/lower hemisphere triangle or mesh generator 653 is configured to receive the output from the converter 651. The upper/lower hemisphere triangle generator 653 in some embodiments comprises two separate generators or two separate functions and is configured to divide the 3D loudspeaker positions into two half-spheres, the top (upper) and the bottom (lower) hemispheres. Both hemispheres include the loudspeakers at the horizontal plane.

The operation of selecting horizontal and above data points is shown in FIG. 6b by step 605.

Having selected the horizontal and above data points the next operation is adding a virtual bottom data point (in other words at elevation −90) as shown in FIG. 6b by step 607.

The following operation, which may be performed by the upper/lower hemisphere triangle or mesh generator 653, is the generation of edges between the datapoints (the upper sphere and the virtual bottom data point). In other words the triangles are formed between the loudspeakers and the virtual bottom data point as shown in FIG. 6b by step 609.

In some embodiments an upper/lower hemisphere triangle (or mesh) analyser 655 is configured to receive the output of the upper/lower hemisphere triangle or mesh generator 653. The upper/lower hemisphere triangle analyser 655 may be configured to determine triangles having edges that include the virtual bottom data point. These may then be removed.

In other words the operation is one of identifying and removing any triangles with edges that include the virtual bottom data point as shown in FIG. 6b by step 611.

A similar set of operations may be performed with respect to the lower hemisphere data points.

The operation of selecting horizontal and below data points is shown in FIG. 6b by step 604.

Having selected the horizontal and below data points the next operation is adding a virtual top data point (in other words at elevation 90) as shown in FIG. 6b by step 606.

The following operation, which may be performed by the upper/lower hemisphere triangle or mesh generator 653, is the generation of triangle/triplets between the datapoints (the lower sphere and the virtual top data point). In other words the triangles are formed between the loudspeakers and the virtual top data point as shown in FIG. 6b by step 608.

In some embodiments an upper/lower hemisphere triangle (or mesh) analyser 655 is configured to receive the output of the upper/lower hemisphere triangle or mesh generator 653. The upper/lower hemisphere triangle analyser 655 may be configured to determine triangles having edges that include the virtual top data point. These may then be removed.

In other words the operation is one of identifying and removing any triangles with edges that include the virtual top data point as shown in FIG. 6b by step 610.

The upper/lower triangle (mesh) combiner 657 may be configured to receive the outputs of the upper/lower triangle (mesh) generator 655 and having generated upper and lower (top and bottom) hemisphere triangles combine them to form a whole sphere. This is shown in FIG. 6b by step 612.

The triplet/gain generator 659 is configured to receive the output of the upper/lower triangle (mesh) combiner 657 and determine panning gain triplets and loudspeaker triplets. In some embodiments this may be performed as the generation of a look-up table or a real time calculation.

The operation of formulating (generating) amplitude panning tables indicating for each panning (azi,ele) angle a loudspeaker triplet and the corresponding gains is shown in FIG. 6b by step 614.

The operation of outputting the amplitude panning tables is shown in FIG. 6b by step 616.

It is noted that the loudspeakers do not need to be exactly at the horizontal plane. For example, in some embodiments the method may utilize a threshold of 10 degrees so that loudspeakers within +/−10 degree elevation are considered to be in the horizontal plane.

This threshold may be a parameter within the system.

An example implementation of the embodiments described above is shown in FIG. 7 which shows an example system decoder and renderer. The example decoder and renderer may be configured to transmit one or two audio channels and spatial metadata. The spatial metadata involves at least a directional parameter in frequency bands and a ratio metadata in frequency bands, where the ratio (or diffuseness) parameter expresses if the sound at the frequency band is directional or ambience, or something in between.

The decoder 700 is shown comprising a demuxer and decoder 701 configured to receive an input bit stream (from any origin, for example, spatial sound captured, encoded and transmitted by a smartphone). The demuxer and decoder 701 is configured to separate the bit stream into an audio signal 706 component, and spatial metadata such as a diffuseness metadata 702 component (which defines an ambient to total energy ratio) and direction metadata 704 component.

The audio signals within the audio component 706 are received by a forward filter bank 703 which (may be complex-modulated low-delay filterbank) configured to transform the audio signals into frequency bands.

The frequency band audio signals may then be received by a divider 705. The divider 705 may furthermore receive the diffuseness metadata component 702 and divide the frequency band signals into direct 710 and an ambient 708 (or diffuse) parts, for example by applying multipliers to the audio signals as a function of the ratio/diffuseness metadata in frequency bands.

The ambience (or diffuse) part 708 may be received by a decorrelator 707 which is configured to decorrelate the ambience part 708 to generate a multi-channel spatially incoherent signal.

A panning table generator 715, such as described above with respect to FIGS. 5a and 6a may be configured to receive the loudspeaker setup information 723 (and other parameters such as the threshold parameter described above) and is configured to generate the gain tables using the triangles with no sides crossing defined virtual planes (for example the horizontal plane).

The direct part 710 may be received by an amplitude panner 709. The amplitude panner 709 may furthermore receive the direction metadata 704 and the amplitude panning tables from the panning table generator 715. The direct part 710 audio signals may then be amplitude panned in frequency bands according to the direction metadata, utilizing the amplitude panning tables generated with the present invention.

A sum module 711 may be configured to receive the direct amplitude panned output from the amplitude panner 709 and the multi-channel spatially incoherent signal from the decorrelator 707 and generate a combined multi-channel signal.

An inverse filter bank 713 may then be configured to receive the combined signal and generate a suitable multi-channel loudspeaker output 725.

The above examples and embodiments may be extended for any suitable use case or implementation where amplitude panning for 3D loudspeaker setups is required. One example is a decoding of a 3D surround sound, where the multi-channel sound involves audio object signals with directional metadata. The amplitude panning tables for the target loudspeaker setup (for example, a cinema loudspeaker system) are generated using the proposed apparatus and method embodiments, and the audio objects are reproduced at their appropriate directions (using the amplitude panning tables or formulated in real-time) according to their directional metadata as a function of time.

A similar implementation or use case is within game audio, where the audio objects (e.g., sound sources at particular directions) are reproduced for 3D loudspeaker setups. In such implementations the user may be given an option to flexibly design the 3D loudspeaker configuration to the geometry of the room, and the method and apparatus as discussed in the embodiments above may be caused to produce amplitude panning gains (or a table) optimized for that setup.

As discussed above in some embodiments can be extended to triangle generation which guarantees that no triangle crosses other planes. For example in some embodiments the amplitude panning gain generator is configured to generate gains using triangulation which does not permit triangles to intersect planes parallel to the reference 0 elevation horizontal plane (as well as or instead of the 0 elevation horizontal plane). In these examples the embodiments follow the above methods, and first prune triangles which span across some of the horizontal planes. This ensures that content moving along elevated horizontal trajectories (where for example loudspeakers are located) can be reproduced with optimal spatial quality.

The concept can also be extended in some embodiments to guarantee that triangles do not cross other arbitrarily set planes. This may be advantageous with certain types of content; for example, if it is known that there are several sound objects which move along trajectories on a plane. An example could be a vertically defined virtual plane, which would guarantee that objects moving along a vertical trajectory are rendered spatially accurately.

In some embodiments the selection of the planes may be adaptively based on content. These embodiments are such that the triangulation operations can be designed adaptively to provide optimal reproduction quality depending on the content types.

Figure 8A:
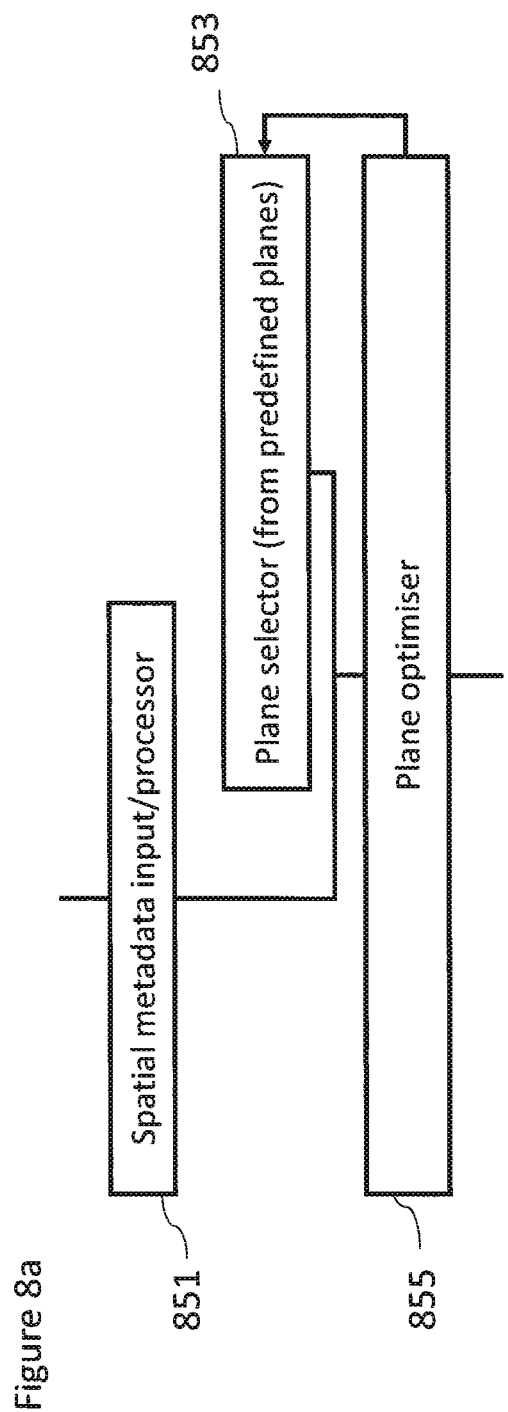
FIG. 8a shows an apparatus for content based plane determination for generating vector base amplitude panning triangulation according to some embodiments.

A first example a method of content selected planes and suitable apparatus for implementing this method are shown in FIGS. 8a and 8b. The concept expressed in this example is one of selecting one or more planes to be used as "no cross" planes in such a way that a maximal amount of sound objects are positioned on the plane and thus prevent generating triangles with sides which cross these defined virtual plane.

In some embodiments the content based plane generator comprises a spatial metadata input or processor 851. The spatial metadata input or processor 851 is configured to obtain or determine spatial metadata associated with the audio signals. For example the spatial metadata may comprise azimuth and elevation for time-frequency tiles, or object spatial position metadata. This is shown in FIG. 8b by step 801.

In some embodiments the content based plane generator comprises a plane selector 853. The plane selector 853 is configured to obtain or determine one or more planes from a set of predefined virtual planes. There may be, for example, a plane stored for each horizontal loudspeaker ring which can be formed for the defined loudspeaker setup.

The operation of obtaining or determining one or more planes from a set of predefined virtual planes is shown in FIG. 8b by step 803.

In some embodiments the content based plane generator comprise a plane optimiser 855. The plane optimiser 855 may be configured to perform a quantization operation to quantize such data samples which are closer than a predefined threshold from the plane in the elevation dimension. A suitable threshold value may be, for example, five degrees.

The quantization of data (spatial positions) is shown in FIG. 8b by step 805.

The principle of quantizing spatial positions to the plane is depicted in FIG. 9.

FIG. 9 thus shows a plane defined by a horizontal ring of loudspeakers 900, 902, 904, 906. Furthermore FIG. 9 shows a first sound object, sound object 1 901, which is located within a defined threshold of the plane. As such the plane optimiser 855 may be configured to map the first sound object to the plane as mapped sound object 1 905. FIG. 9 also shows a second sound object, sound object 2 903, which is located outside a defined threshold of the plane and would not be mapped to the plane. In other words if the data sample is farther than the threshold amount from the plane it is ignored.

The plane optimiser 855 may then be configured to count the number of data samples quantized to the current plane.

The operation of counting the number of data samples quantized to the plane is shown in FIG. 8*b* by step 807.

A plane which maximally passes through spatial positions containing frequent sound content is the best candidate to be used as the no-cross plane. The plane quantizer may thus determine whether the current selected plane is the first selected plane or is better than the previously stored plane.

The operation of determining whether the plane is the first or better plane for selection is shown in FIG. 8*b* by step 809.

If this is the first selected plane or more quantized samples are on this plane than on the previous plane, the parameters of the plane are stored such as shown in FIG. 8*b* by step 811.

Otherwise, the method may proceed to select a next plane (for example by indicating to the plane selector 853 to select another plane) and repeat the method for this newly selected plane. This is shown in FIG. 8*b* by the "repeat for all candidate planes" loop arrow from step 809 and 811 to step 803.

In some embodiments the plane optimizer is configured to determine whether all planes have been processed. If there are some planes to be checked the plane selector 853 may be caused to select another plane to check/process. When all planes have been processed, the stored, optimized, plane is passed to be used in the triangulation methods described above and used instead or in addition to the horizontal plane. In some embodiments more than one content selected planes may be determined.

Figure 10:
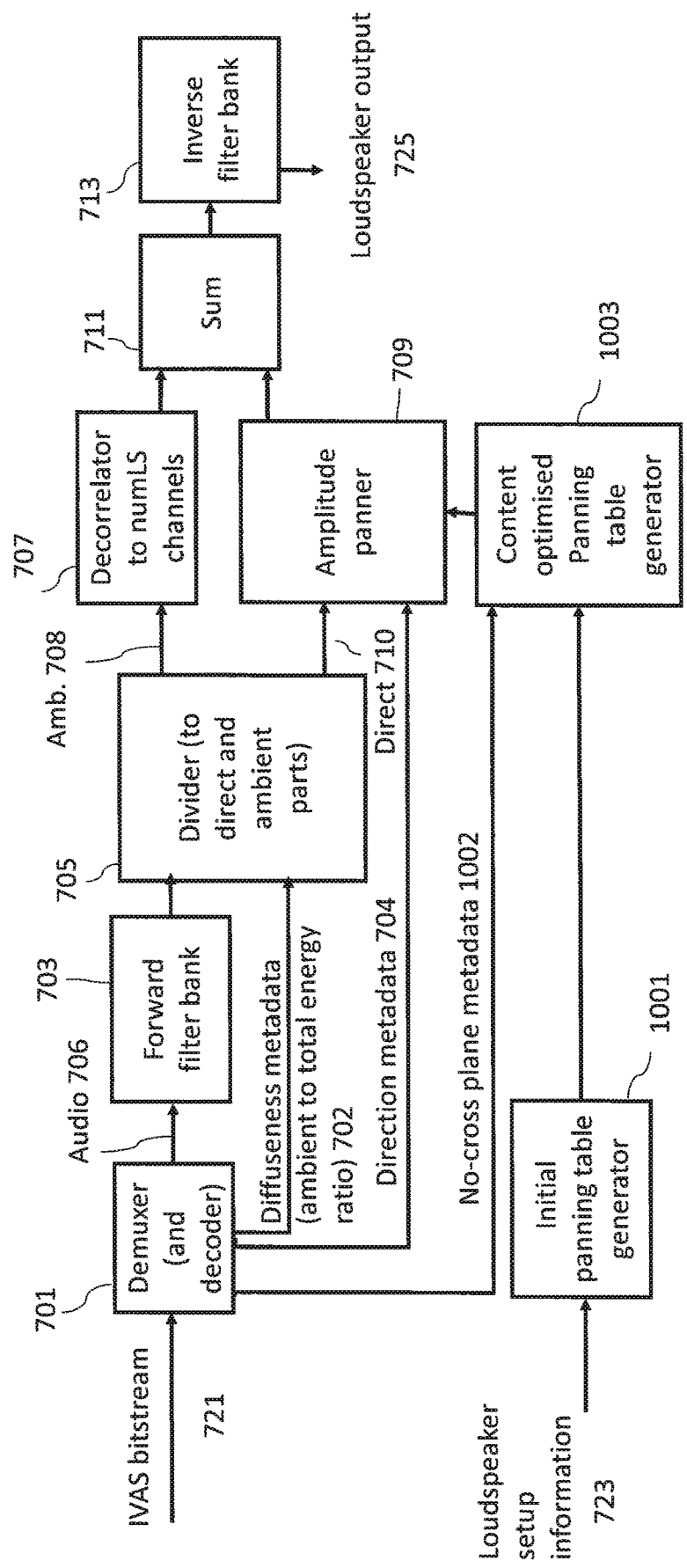
FIG. 10 shows schematically further apparatus suitable for employing the methods of generating vector base amplitude panning triangulation with content adaptation according to some embodiments.

With respect to FIG. 10 an example implementation of the content based plane selection embodiments is shown. FIG. 10 shows a modification of the apparatus shown in FIG. 7. In such a content capture/encoding and rendering scenario, the system may determine such planes adaptively for different portions of the content during content capture and/or encoding. In other words in some embodiments the content related plane apparatus is implemented within the capturing or processing apparatus and these no-cross planes as determined by the audio signal content analysis are encoded and passed to the decoder.

Thus for example in the apparatus shown in FIG. 10 the demuxer and decoder 701 is configured to output no-cross plane metadata 1002.

Figure 7:
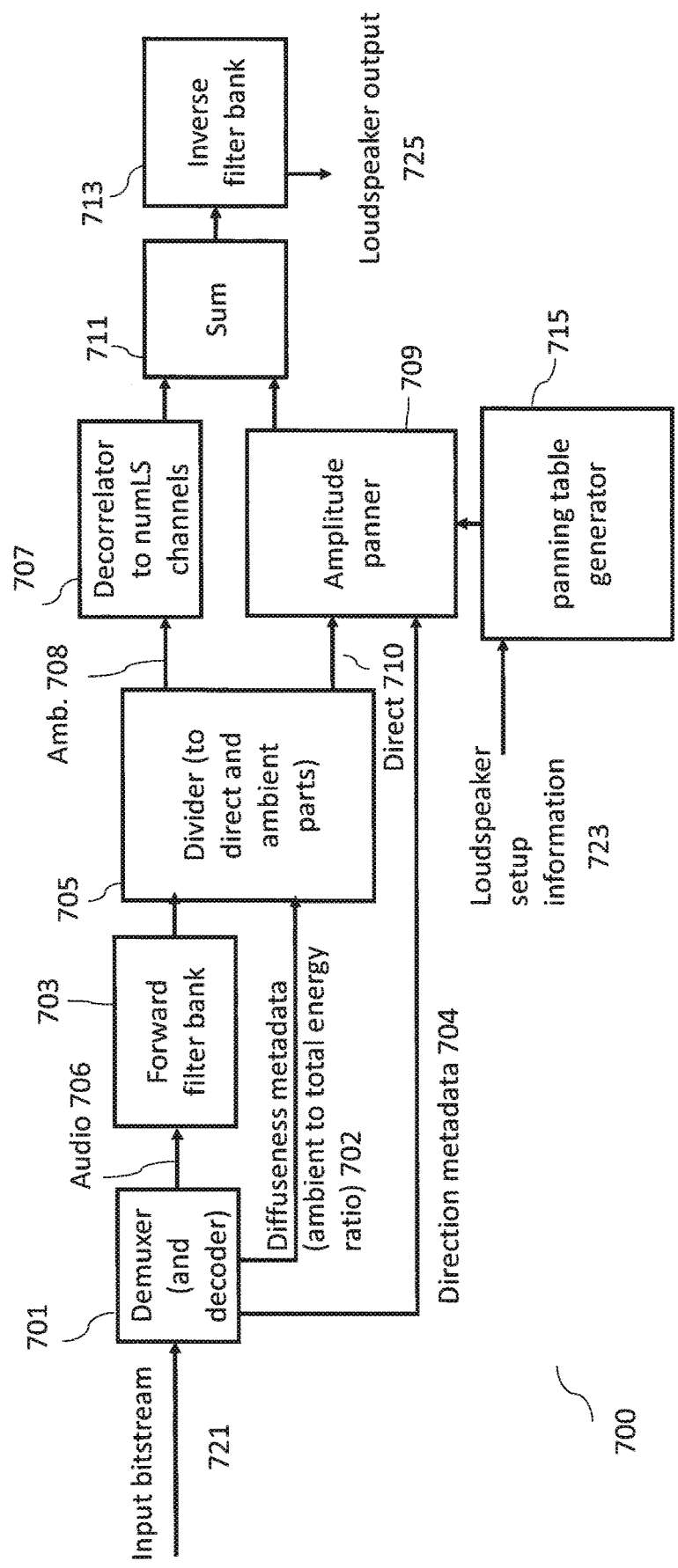
FIG. 7 shows schematically apparatus suitable for employing the methods of generating vector base amplitude panning triangulation according to some embodiments.

The several planes may be defined for the loudspeaker configuration within the initial panning table generator 1001, which may be similar to the panning table generator shown in FIG. 7 which is configured to compute panning tables for triangles with all possible planes from a set of planes in the decoder. The parameter identifying the no-cross plane or planes selected based on the content is signalled to the content optimised panning table generator 1003 along with the output from the initial panning table generator 1001. The content optimised panning table generator 1003 then selects the gain tables to be used. In addition in some embodiments time stamp information is signalled to indicate the time period when a plane should be used. The renderer may then perform VBAP panning using the gains corresponding to the triangulation determined by the content optimised panning table generator 1003 along with the direction metadata.

In some embodiments the determination of the planes may also be done by a content creator instead of an automatic mechanism. In reproduction of audio objects, the determined plane for one object may be different than the determined plane for another object.

As discussed above although the examples above have been explained in the context of loudspeaker playback, when using either physical or virtual loudspeakers. However, triangulation may be applied also in the context of binaural filtering, when selecting the closest binaural filters from a binaural filter database to be used for reproducing a sound object.

Figure 11:
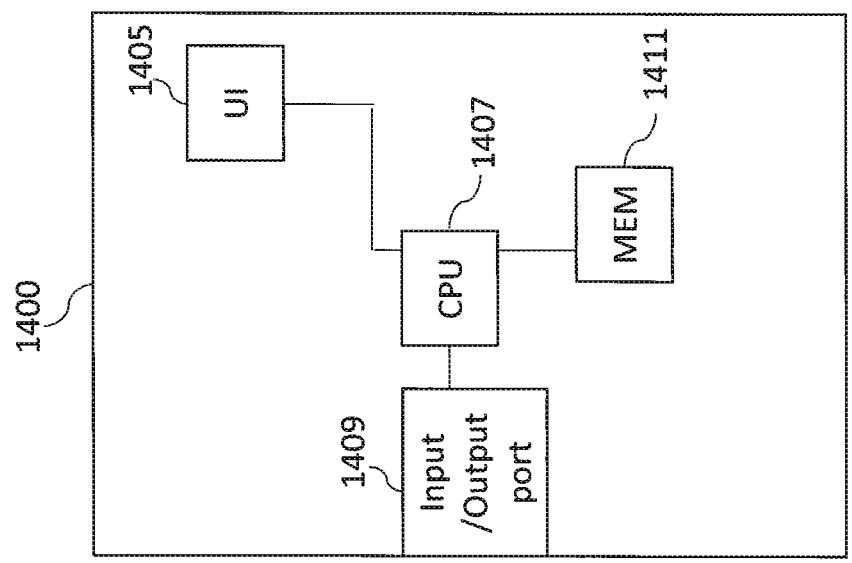
FIG. 11 shows schematically an example device suitable for implementing the apparatus shown.

With respect to FIG. 11 an example electronic device which may be used as the analysis or synthesis device is shown. The device may be any suitable electronics device or apparatus. For example in some embodiments the device 1400 is a mobile device, user equipment, tablet computer, computer, audio playback apparatus, etc.

In some embodiments the device 1400 comprises at least one processor or central processing unit 1407. The processor 1407 can be configured to execute various program codes such as the methods such as described herein.

In some embodiments the device 1400 comprises a memory 1411. In some embodiments the at least one processor 1407 is coupled to the memory 1411. The memory 1411 can be any suitable storage means. In some embodiments the memory 1411 comprises a program code section for storing program codes implementable upon the processor 1407. Furthermore in some embodiments the memory 1411 can further comprise a stored data section for storing data, for example data that has been processed or to be processed in accordance with the embodiments as described herein. The implemented program code stored within the program code section and the data stored within the stored data section can be retrieved by the processor 1407 whenever needed via the memory-processor coupling.

In some embodiments the device 1400 comprises a user interface 1405. The user interface 1405 can be coupled in some embodiments to the processor 1407. In some embodiments the processor 1407 can control the operation of the user interface 1405 and receive inputs from the user interface 1405. In some embodiments the user interface 1405 can enable a user to input commands to the device 1400, for example via a keypad. In some embodiments the user interface 1405 can enable the user to obtain information from the device 1400. For example the user interface 1405 may comprise a display configured to display information from the device 1400 to the user. The user interface 1405 can in some embodiments comprise a touch screen or touch interface capable of both enabling information to be entered to the device 1400 and further displaying information to the user of the device 1400. In some embodiments the user interface 1405 may be the user interface for communicating with the position determiner as described herein.

In some embodiments the device 1400 comprises an input/output port 1409. The input/output port 1409 in some embodiments comprises a transceiver. The transceiver in such embodiments can be coupled to the processor 1407 and configured to enable a communication with other apparatus or electronic devices, for example via a wireless communications network. The transceiver or any suitable transceiver or transmitter and/or receiver means can in some embodiments be configured to communicate with other electronic devices or apparatus via a wire or wired coupling.

The transceiver can communicate with further apparatus by any suitable known communications protocol. For example in some embodiments the transceiver can use a suitable universal mobile telecommunications system (UMTS) protocol, a wireless local area network (WLAN)

protocol such as for example IEEE 802.X, a suitable short-range radio frequency communication protocol such as Bluetooth, or infrared data communication pathway (IRDA).

The transceiver input/output port 1409 may be configured to receive the signals and in some embodiments determine the parameters as described herein by using the processor 1407 executing suitable code. Furthermore the device may generate a suitable downmix signal and parameter output to be transmitted to the synthesis device.

In some embodiments the device 1400 may be employed as at least part of the synthesis device. As such the input/output port 1409 may be configured to receive the downmix signals and in some embodiments the parameters determined at the capture device or processing device as described herein, and generate a suitable audio signal format output by using the processor 1407 executing suitable code. The input/output port 1409 may be coupled to any suitable audio output for example to a multichannel speaker system and/or headphones or similar.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. An apparatus for spatial audio signal decoding associated with a plurality of speaker nodes placed within a three dimensional space, the apparatus comprising at least one processor and at least one memory including a computer program code, the at least one memory and the computer program code configured to, with the at least one processor, cause the apparatus at least to:

determine a non-overlapping virtual surface arrangement, wherein the non-overlapping virtual surface arrangement comprises a plurality of virtual surfaces with corners positioned at least three speaker nodes of the plurality of speaker nodes and sides connecting pairs of corners configured to be non-intersecting with at least one defined virtual plane within the three dimensional space, wherein the non-overlapping virtual surface arrangement is determined by the apparatus being configured to:

divide the plurality of speaker nodes into parts, wherein at least one part comprises speaker nodes located to one side or on the defined virtual plane, and at least one further part comprises speaker nodes located to the other side or on the defined virtual plane;

determine virtual surface edges for the at least one part and virtual surface edges for the at least one further part; and combine the virtual surface edges for the at least one part and the virtual surface edges for the at least one further part to generate the plurality of virtual surfaces and therefore determine the non-overlapping virtual surface arrangement;

generate gains for the plurality of speaker nodes based on the non-overlapping virtual surface arrangement; and apply the gains to at least one audio signal, the at least one audio signal to be positioned within the three dimensional space, wherein the apparatus, when dividing the speaker nodes into parts, is configured to divide the speaker nodes into an additional part comprising speaker nodes located on or close to the defined virtual plane, and wherein the apparatus, when determining the virtual surface edges for the at least one part, is further configured to virtually connect speaker nodes for the at least one part comprising speaker nodes located on or close to the defined virtual plane.

2. The apparatus as claimed in claim 1, wherein the apparatus caused to determine the virtual surface edges is further caused to:
  determine candidate virtual surface edges based on selecting pairs of speaker nodes from the plurality of speaker nodes; and
  process the candidate virtual surface edges to determine the virtual surface edges.

3. The apparatus as claimed in claim 2, wherein the apparatus caused to process the candidate virtual surface edges to determine the virtual surface edges is further caused to:
  select one of the candidate virtual surface edges until all of the candidate virtual surface edges are selected;
  discard the one of the candidate virtual surface edges when the one of the candidate virtual surface edges crosses the at least one defined virtual plane;
  discard the one of the candidate virtual surface edges when the one of the candidate virtual surface edges has any speaker node substantially behind, with respect to a defined observation point, the one of the candidate virtual surface edges; and
  determine whether the one of the candidate virtual surface edges intersect with at least one previous candidate virtual surface edge and discard the at least one previous candidate virtual surface edge when the previous candidate virtual surface edge was longer and otherwise discard the one of the candidate virtual surface edges.

4. The apparatus as claimed in claim 3, wherein the apparatus caused to determine whether the one of the candidate virtual surface edges intersect with at least one previous candidate virtual surface edge and discard the at least one previous candidate virtual surface edge when the previous candidate virtual surface edge was longer and otherwise discard the one of the candidate virtual surface edges is caused to apply at least one weighting a length of one or other of the candidate virtual surface edges and/or previous candidate virtual surface edge prior to a comparison.

5. The apparatus as claimed in claim 1, further caused to add at least one virtual speaker node at a defined location.

6. The apparatus as claimed in claim 5, caused to add at least one virtual speaker node at a defined location is caused to perform at least one of:
  add a virtual speaker node directly at the top of a sphere defined by the speaker nodes;
  add a virtual speaker node directly at the bottom of a sphere defined by the speaker nodes; and
  add at least one virtual speaker node where speaker nodes are determined to be sparse.

7. The apparatus as claimed in claim 1, further caused to move at least one speaker node to the at least one defined virtual plane when the at least one speaker node is within a defined threshold distance from the at least one defined virtual plane.

8. The apparatus as claimed in claim 1, further caused to remove at least one speaker node when the at least one speaker node is within a defined threshold distance of at least one further speaker node.

9. The apparatus as claimed in the claim 1, further caused to merge at least two speaker nodes when the at least two speaker nodes are within a defined threshold distance of each other.

10. The apparatus as claimed in claim 1, wherein the at least one defined virtual plane is at least one of:
  a horizontal plane with an elevation of zero;
  a horizontal plane linking at least two or more speaker nodes;
  a plane linking at least two or more speaker nodes; and
  a plane defined by analysis of the at least one audio signal.

11. The apparatus as claimed in claim 1, wherein the speaker nodes comprise at least one of:
  a physical loudspeaker;
  a virtual loudspeaker; and
  a binaural filter node.

12. A method comprising:
  determining a non-overlapping virtual surface arrangement in a three dimensional space including a plurality of speaker nodes, the non-overlapping virtual surface arrangement comprising a plurality of virtual surfaces with corners positioned at least three speaker nodes of the plurality of speaker nodes and sides connecting pairs of corners configured to be non-intersecting with at least one defined virtual plane within the three dimensional space, wherein determining the non-overlapping virtual surface arrangement comprises:
    dividing the speaker nodes into parts, wherein at least one part comprises speaker nodes located to one side or on the defined virtual plane, and at least one further part comprises speaker nodes located to the other side or on the defined virtual plane;
    determining virtual surface edges for the at least one part and virtual surface edges for the at least one further part; and
    combining the virtual surface edges for the at least one part and the virtual surface edges for the at least one further part to generate the plurality of virtual surfaces and therefore determine the non-overlapping virtual surface arrangement;
  generating gains for the plurality of speaker nodes based on the non-overlapping virtual surface arrangement; and
  applying the gains to at least one audio signal, the at least one audio signal to be positioned within the three dimensional space, wherein dividing the speaker nodes into parts comprises dividing the speaker nodes into an additional part comprising speaker nodes located on or close to the defined virtual plane, and wherein determining the virtual surface edges for the at least one part comprises virtually connecting speaker nodes for the at least one part comprising speaker nodes located on or close to the defined virtual plane.

13. The method as claimed in claim 12, wherein determining the virtual surface edges further comprises:
  determining candidate virtual surface edges based on selecting pairs of speaker nodes from the plurality of speaker nodes; and
  processing the candidate virtual surface edges to determine the virtual surface edges.

14. The method as claimed in claim 13, wherein processing the candidate virtual surface edges to determine the virtual surface edges further comprises:
  selecting one of the candidate virtual surface edges until all of the candidate virtual surface edges are selected;
  discarding the one of the candidate virtual surface edges when the one of the candidate virtual surface edges crosses the at least one defined virtual plane;
  discarding the one of the candidate virtual surface edges when the one of the candidate virtual surface edges has any speaker node substantially behind, with respect to a defined observation point, the one of the candidate virtual surface edges; and determining whether the one of the candidate virtual surface edges intersect with at least one previous candidate virtual surface edge and discard the at least one previous candidate virtual surface edge when the previous candidate virtual surface edge was longer and otherwise discard the one of the candidate virtual surface edges.

15. The method as claimed in claim 14, wherein determining whether the one of the candidate virtual surface edges intersect with at least one previous candidate virtual surface edge and discarding the at least one previous candidate virtual surface edge when the previous candidate virtual surface edge was longer and otherwise discard the one of the candidate virtual surface edges comprises applying at least one weighting a length of one or other of the candidate virtual surface edges and/or previous candidate virtual surface edge prior to a comparison.

16. The method as claimed in claim 12, further comprising adding at least one virtual speaker node at a defined location.

17. The method as claimed in claim 16, wherein adding at least one virtual speaker node at a defined location further comprises:
   adding a virtual speaker node directly at a top of a sphere defined by the speaker nodes;
   adding a virtual speaker node directly at a bottom of the sphere defined by the speaker nodes; and
   adding at least one virtual speaker node where speaker nodes are determined to be sparse.

18. The method as claimed in claim 12, the method further comprising moving at least one speaker node to the at least one defined virtual plane when the at least one speaker node is within a defined threshold distance from the at least one defined virtual plane.

19. The method as claimed in claim 12, the method further comprising removing at least one speaker node when the at least one speaker node is within a defined threshold distance of at least one further speaker node.

20. A computer program product for spatial audio signal decoding associated with a plurality of speaker nodes placed within a three dimensional space, the computer program product embodied on a non-transitory computer readable medium, and comprising computer program code configured to, when executed on at least one processor, cause an apparatus or a system to perform:
   determine a non-overlapping virtual surface arrangement, wherein the non-overlapping virtual surface arrangement comprises a plurality of virtual surfaces with corners positioned at least three speaker nodes of the plurality of speaker nodes and sides connecting pairs of corners configured to be non-intersecting with at least one defined virtual plane within the three dimensional space, wherein the non-overlapping virtual surface arrangement is determined by the computer program code being configured to:
      divide the plurality of speaker nodes into parts, wherein at least one part comprises speaker nodes located to one side or on the defined virtual plane, and at least one further part comprises speaker nodes located to the other side or on the defined virtual plane;
      determine virtual surface edges for the at least one part and virtual surface edges for the at least one further part; and
      combine the virtual surface edges for the at least one part and the virtual surface edges for the at least one further part to generate the plurality of virtual surfaces and therefore determine the non-overlapping virtual surface arrangement;
   generate gains for the plurality of speaker nodes based on the non-overlapping virtual surface arrangement; and
   apply the gains to at least one audio signal, the at least one audio signal to be positioned within the three dimensional space, wherein the computer program code is configured when dividing the speaker nodes into parts, to divide the speaker nodes into an additional part comprising speaker nodes located on or close to the defined virtual plane, and wherein the computer program code, when determining the virtual surface edges for the at least one part, is further configured to virtually connect speaker nodes for the at least one part comprising speaker nodes located on or close to the defined virtual plane.

* * * * *

UNITED STATES PATENT AND TRADEMARK OFFICE
CERTIFICATE OF CORRECTION

PATENT NO. : 11,302,339 B2
APPLICATION NO. : 16/978032
DATED : April 12, 2022
INVENTOR(S) : Mikko-Ville Laitinen et al.

It is certified that error appears in the above-identified patent and that said Letters Patent is hereby corrected as shown below:

In the Specification

In Column 1, Line 7, delete "PCT/F12019/050179," and insert -- PCT/FI2019/050179, --, therefor.

Signed and Sealed this
Ninth Day of May, 2023

Katherine Kelly Vidal
Director of the United States Patent and Trademark Office